United States Patent
Woo et al.

(10) Patent No.: US 9,773,544 B2
(45) Date of Patent: Sep. 26, 2017

(54) MEMORY DEVICE WITH SWITCHABLE SENSE AMPLIFIER

(71) Applicant: SAMSUNG ELECTRONICS CO., LTD., Suwon-Si, Gyeonggi-Do (KR)

(72) Inventors: Jun-Myung Woo, Seoul (KR); Young-Seok Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/208,640

(22) Filed: Jul. 13, 2016

(65) Prior Publication Data

US 2017/0069368 A1    Mar. 9, 2017

(30) Foreign Application Priority Data

Sep. 9, 2015 (KR) .................. 10-2015-0127705

(51) Int. Cl.
   *G11C 7/00* (2006.01)
   *G11C 11/4091* (2006.01)
   *G11C 11/4094* (2006.01)

(52) U.S. Cl.
   CPC ...... *G11C 11/4091* (2013.01); *G11C 11/4094* (2013.01)

(58) Field of Classification Search
   CPC .................................. G11C 11/4091
   USPC ...................................... 365/205
   See application file for complete search history.

(56) References Cited

U.S. PATENT DOCUMENTS

| 6,397,361 | B1 | 5/2002 | Saitoh |
| 7,123,531 | B2 | 10/2006 | Rho |
| 7,227,798 | B2 | 6/2007 | Gupta et al. |
| 7,570,529 | B2 | 8/2009 | Kim et al. |
| 7,800,416 | B2 | 9/2010 | Kim et al. |
| 8,125,840 | B2 | 2/2012 | Barth, Jr. et al. |
| 8,451,649 | B2 | 5/2013 | Choi |
| 2005/0180206 | A1 | 8/2005 | Randell et al. |

(Continued)

FOREIGN PATENT DOCUMENTS

| JP | 2000-183739 | 6/2000 |
| KR | 1020030020124 | 3/2003 |

(Continued)

OTHER PUBLICATIONS

Low-Voltage DRAM Sensing Scheme With Offset-Cancellation Sense Amplifier.

*Primary Examiner* — Hoai V Ho
(74) *Attorney, Agent, or Firm* — Volentine & Whitt, PLLC

(57) ABSTRACT

A switchable sense amplifier includes a sense amplification unit and a plurality of switches. The sense amplification unit senses a voltage change of a bit line connected to a memory cell and amplifies a voltage difference between the bit line and a complementary bit line. The plurality of switches operate according to switching signals, and thus, enable the sense amplification unit to perform a pre-charging operation, an offset cancellation operation, a charge sharing operation, a sensing operation, and a re-storing operation. The sense amplifier may enhance an effective sensing margin by compensating for an offset of the sense amplifier, through an offset cancellation operation, and thus enhance performance of a memory apparatus.

13 Claims, 24 Drawing Sheets

(56) References Cited

U.S. PATENT DOCUMENTS

| | | | |
|---|---|---|---|
| 2005/0219925 A1* | 10/2005 | Rho | G11C 7/065 365/205 |
| 2008/0151664 A1 | 6/2008 | Kim et al. | |
| 2011/0133809 A1* | 6/2011 | Goel | G11C 11/4091 327/307 |
| 2015/0036444 A1* | 2/2015 | Seo | G11C 7/065 365/210.1 |

FOREIGN PATENT DOCUMENTS

| | | |
|---|---|---|
| KR | 10-0771544 | 10/2007 |
| KR | 100896462 | 4/2009 |
| KR | 1020100030226 | 3/2010 |
| KR | 10-1027673 | 3/2011 |
| KR | 1020100014808 | 8/2011 |
| KR | 1020110095022 | 8/2011 |

\* cited by examiner

Precharging Operation

Offset Cancelling Operation

Charge Sharing Operation

Sensing & Restoring Operation

Offset Cancelling Operation

Charge Sharing Operation

Offset Cancelling Operation

Offset Cancelling Operation

MEMORY DEVICE WITH SWITCHABLE SENSE AMPLIFIER

CROSS-REFERENCE TO RELATED APPLICATION

This application claims the benefit of Korean Patent Application No. 10-2015-0127705, filed on Sep. 9, 2015, in the Korean Intellectual Property Office, the disclosure of which is incorporated herein in its entirety by reference.

BACKGROUND

The disclosure relates to a semiconductor memory apparatus, and more particularly, to a memory apparatus for enhancing an effective sensing margin of a sense amplifier by selectively switching switches in the sense amplifier.

A dynamic random access memory (DRAM), from among memory apparatuses, is operated by using a method of writing data by using electric charges stored in a cell capacitor in a memory cell. Memory cells are connected between a bit line (BL) and a complementary bit line (BLB). In the DRAM, if a read operation or a refresh operation is performed, a sense amplifier senses and amplifies a voltage difference between the BL and the BLB. Semiconductor elements constituting the sense amplifier may have different characteristics, for example threshold voltages, from each other due to process, voltage, or temperature variation (PVT), or the like. Accordingly, offset noise of the sense amplifier may be caused. The offset noise may reduce an effective sensing margin of the sense amplifier, and performance of a DRAM may deteriorate.

SUMMARY

The disclosure describes a sense amplifier and a memory apparatus for enhancing an effective sensing margin based on an operation of cancelling an offset of the sense amplifier, by selectively switching switches included in the sense amplifier.

According to an aspect of the disclosure, there is provided a sense amplifier having a sense amplification unit and a plurality of switches. The sense amplification unit is connected to a bit line, which is connected to a bit line, and a complementary bit line and is configured to sense a voltage change of the bit line and amplify a voltage difference between the bit line and the complementary bit line based on the sensed voltage change. The switches are connected to the sense amplification unit and configured to perform an offset cancelling operation of cancelling an offset between the bit line and the complementary bit line according to switching signals, when a word line of the memory cell is activated.

According to another aspect of the disclosure, there is provided a memory apparatus amplifier having a memory cell array and sense amplifiers. The memory cell array includes a plurality of sub-cell arrays, each of the sub-cell arrays including a plurality of memory cells. The sense amplifiers are connected to the sub-cell arrays and have an open bit line structure. An edge sense amplifier, among the sense amplifiers, is disposed at an outer edge of the memory cell array and includes: a bit line connected to a memory cell selected from the memory cells; a complementary bit line that is not connected to a memory cell; a sense amplification unit connected to the bit line and the complementary bit line, and switches. The sense amplification unit is configured to sense a voltage change of the bit line and amplify a voltage difference between the bit line and the complementary bit line based on the sensed voltage change, when a word line of the selected memory cell is activated. The switches are connected to the sense amplification unit and configured to perform, according to switching signals, an offset cancelling operation by developing an offset voltage between the bit line and the complementary bit line.

According to another aspect of the disclosure, there is provided a sense amplifier having amplification transistors and switches. The switches are selectively activated to form interconnections with the amplification transistors so as to selectively create each of a sense amplification circuit and an offset cancellation circuit. The sense amplification circuit amplifies a voltage difference existing between a voltage existing on a bit line, addressing a memory cell, and a voltage existing on a complementary bit line when a word line addressing the memory cell is activated. The offset cancellation circuit removes an offset voltage existing between a voltage existing on the bit line and a voltage existing on the complementary bit line when the word line addressing the memory cell is not activated.

BRIEF DESCRIPTION OF THE DRAWINGS

Exemplary embodiments of the disclosure will be more clearly understood from the following detailed description taken in conjunction with the accompanying drawings in which.

DETAILED DESCRIPTION OF THE EMBODIMENTS

Figure 1:
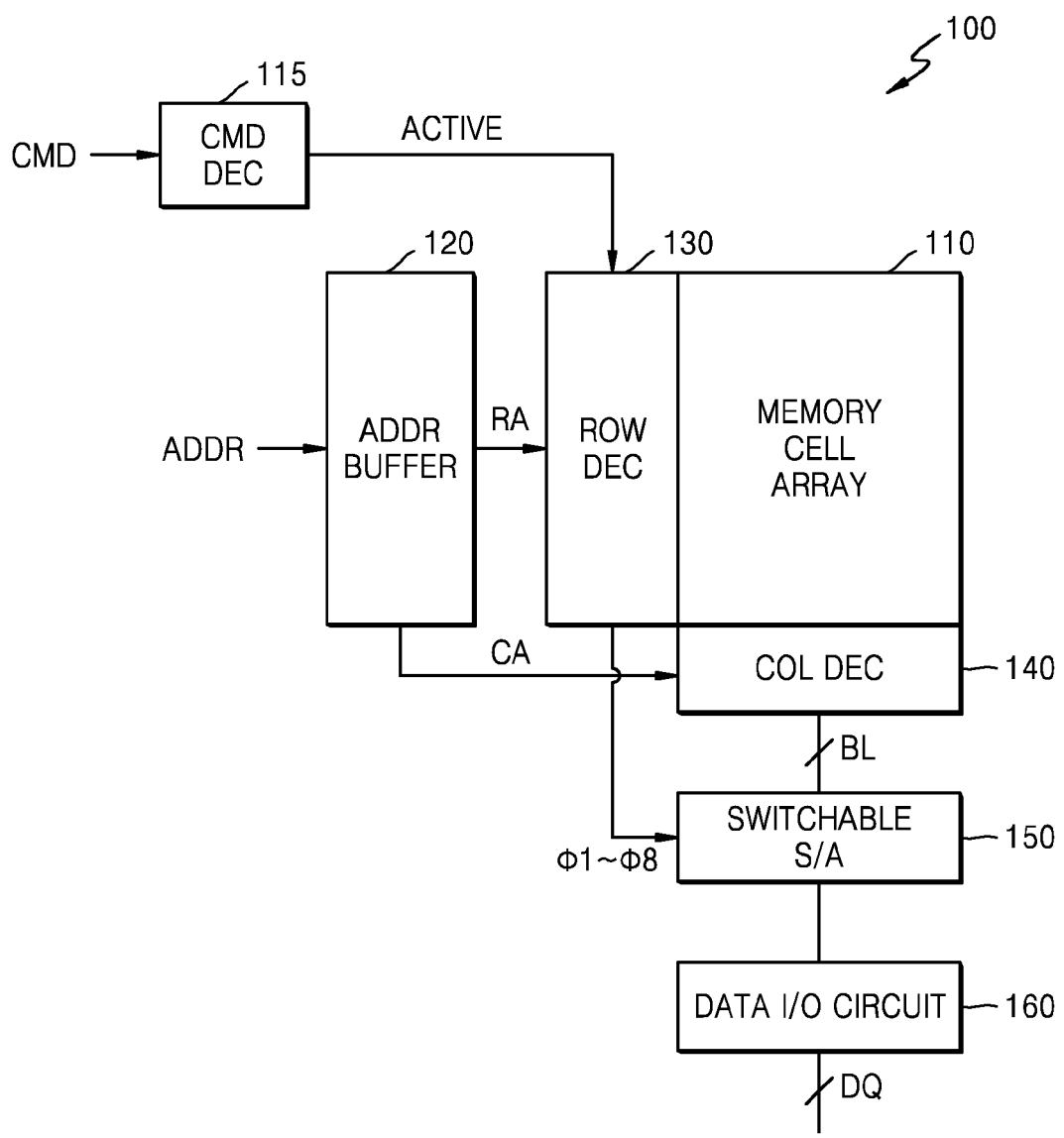
FIG. 1 illustrates a diagram for explaining a memory apparatus according to exemplary embodiments.

As used herein, the term "and/or" includes any and all combinations of one or more of the associated listed items.

The attached drawings for illustrating exemplary embodiments of the disclosure are referred to in order to gain a sufficient understanding of the disclosure, the merits thereof, and the objectives accomplished by the implementation of the disclosure.

Exemplary embodiments will now be described more fully with reference to the accompanying drawings. The disclosure may, however, be embodied in many different forms and should not be construed as being limited to the embodiments set forth herein; rather, these embodiments are provided so that this disclosure will be thorough and complete, and will fully convey the concept of the disclosure to those skilled in the art. As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure. Like reference numerals in the drawings denote like elements, and thus their description will be omitted. In the drawings, the lengths and sizes of layers and regions are exaggerated for clarity.

The terms used in the present specification are merely used to describe particular embodiments, and are not intended to limit the disclosure. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Unless otherwise defined, all terms (including technical and scientific terms) used herein may be used as having a meaning that can be understood in common by those of ordinary skill in the art. The general terms that are defined in a generally used dictionary are interpreted as having meanings that are consistent with their meanings in the context of the relevant art and will not be interpreted in an idealized or overly formal sense unless expressly so defined herein.

FIG. 1 illustrates a diagram for explaining a memory apparatus 100 according to exemplary embodiments.

Referring to FIG. 1, the memory apparatus 100 may be a storage apparatus that is based on a semiconductor device. For example, the memory apparatus 100 may be a dynamic random access memory (DRAM) such as synchronous DRAM (SDRAM), double data rate SDRAM (DDR SDRAM), low power double data rate SDRAM (LPDDR SDRAM), graphics double data rate SDRAM (GDDR SDRAM), DDR2 SDRAM, DDR3 SDRAM, or DDR4 SDRAM, or a resistive memory such as phase change random access memory (PRAM), magnetic random access memory (MRAM), resistive random access memory (RRAM), or the like.

The memory apparatus 100 may output data via data lines DQ in response to a command CMD, an address ADDR, and control signals received from an external apparatus, for example, a memory controller. The memory apparatus 100 includes a memory cell array 110, a command decoder 115, an address buffer 120, a row decoder 130, a column decoder 140, a sense amplifier 150, and a data input/output circuit 160.

The memory cell array 110 includes a plurality of memory cells which are arranged in rows and columns in the form of a matrix. The memory cell array 110 includes a plurality of word lines and a plurality of bit lines BL which are connected to the plurality of memory cells. The plurality of word lines may be connected to rows of the plurality of memory cells and the plurality of bit lines may be connected to columns of the plurality of memory cells.

The command decoder 115 may generate control signals in correspondence with the command CMD, by decoding a write enable signal (/WE), a row address strobe signal (/RAS), a column address strobe signal (/CAS), a chip selection signal (/CS), or the like which is received from an external apparatus, for example, a memory controller. The command CMD may include an active command, a read command, a write command, a precharge command, or the like. The command decoder 115 may generate an active signal ACTIVE based on the active command.

The address buffer 120 receives an address ADDR from an external apparatus, for example, a memory controller. The address ADDR includes a row address RA that addresses a row of the memory cell array 110 and a column address CA that addresses a column of the memory cell array 110. The address buffer 120 may transmit the row address RA to the row decoder 130, and the column address CA to the column decoder 130.

The row decoder 130 may select one from among the plurality of word lines connected to the memory cell array 110. The row decoder 130 may decode the row address RA received from the address buffer 120, select a word line corresponding to the row address RA, and thus, activate the selected word line.

The column decoder 140 may select a certain bit line from among the plurality of bit lines BL included in the memory cell array 110. The column decoder 140 may decode the column address CA received from the address buffer 120, and thus, select a bit line corresponding to the column address CA.

The sense amplifier 150 is connected to the plurality of bit lines BL included in the memory cell array 110. The sense amplifier 150 senses a change in a voltage in a bit line selected from among the plurality of bit lines BL, and then, amplifies and outputs the change in the voltage. The data input/output circuit 160 may output data, which is output based on the change in the voltage sensed and amplified by the sense amplifier 150, to outside via the data lines DQ.

The sense amplifier 150 may receive switching signals Φ1 through Φ8 from the row decoder 130. The switching signals Φ1 through Φ8 may be provided by the row decoder 130 in response to the active signal ACTIVE received from the command decoder 115, and selectively activated when a word line driving voltage is applied to a word line corresponding to the row address RA.

The switching signals Φ1 through Φ8 may control a plurality of switches included in the sense amplifier 150. As the plurality of switches are turned on or off according to the switching signals Φ1 through Φ8, the sense amplifier 120 may perform a precharge operation, an offset cancellation operation, a charge sharing operation, and a sensing and re-storing operation. The sense amplifier 150 that operates based on a switching operation of the plurality of switches according to the switching signals Φ1 through Φ8 may be referred to as a switchable sense amplifier (S/A) for convenience of description.

Hereinafter, a configuration and an operation of the sense amplifier 150 are described in detail by explaining various exemplary embodiments.

Figure 2A:
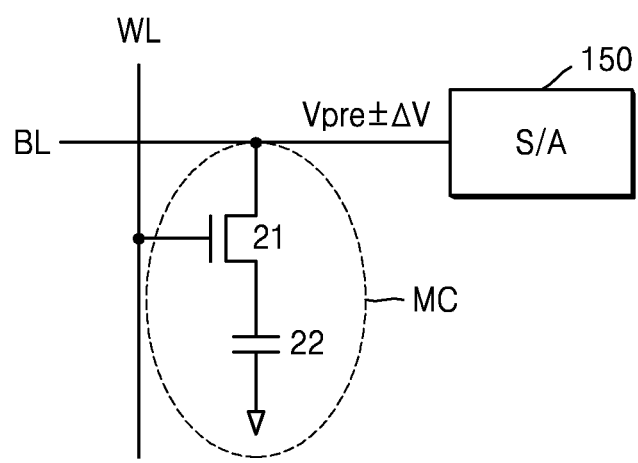
FIGS. 2A and 2B illustrate diagrams for explaining an operation of sensing, by a sense amplifier shown in FIG. 1, a bit line voltage.
Figure 2B:
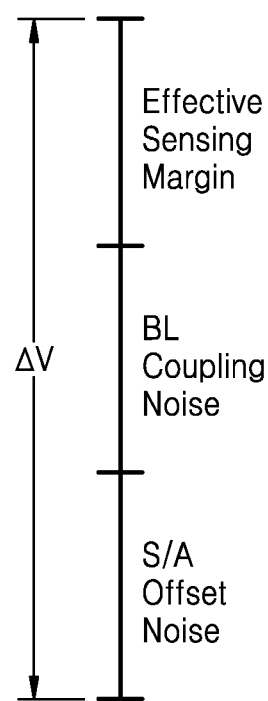

FIGS. 2A and 2B illustrate diagrams for explaining an operation of sensing, by the sense amplifier 150 shown in FIG. 1, a bit line voltage.

Referring to FIGS. 1 and 2A, a memory cell MC included in the memory cell array 110 consists of a cell transistor 21 and a cell capacitor 22. The memory apparatus 100 may perform a read operation and a refresh operation based on the amount of electric charge in the cell capacitor 22 included in the memory cell MC. A bit line BL connected to the memory cell MC is charged with a precharge voltage Vpre. Then, as a word line WL is activated, a charge sharing operation is performed in which electric charges are shared between the bit line BL, charged with the precharge voltage Vpre, and the cell capacitor 22 included in the memory cell MC. A voltage of the bit line BL may be decreased or increased from the precharged voltage Vpre by a voltage change amount ΔV, according to the charge sharing operation.

The sense amplifier 150 may sense and amplify the voltage change amount ΔV. The voltage change amount ΔV, as shown in FIG. 2B, may include an effective sensing margin, bit line coupling noise, sense amplifier offset noise, or the like. If the voltage change amount ΔV is equal to less than a certain level, the sense amplifier 150 may be unable to sense the voltage change amount ΔV in a bit line BL. In other words, the sense amplifier offset noise may reduce an effective sensing margin of the sense amplifier 150.

Figure 3:
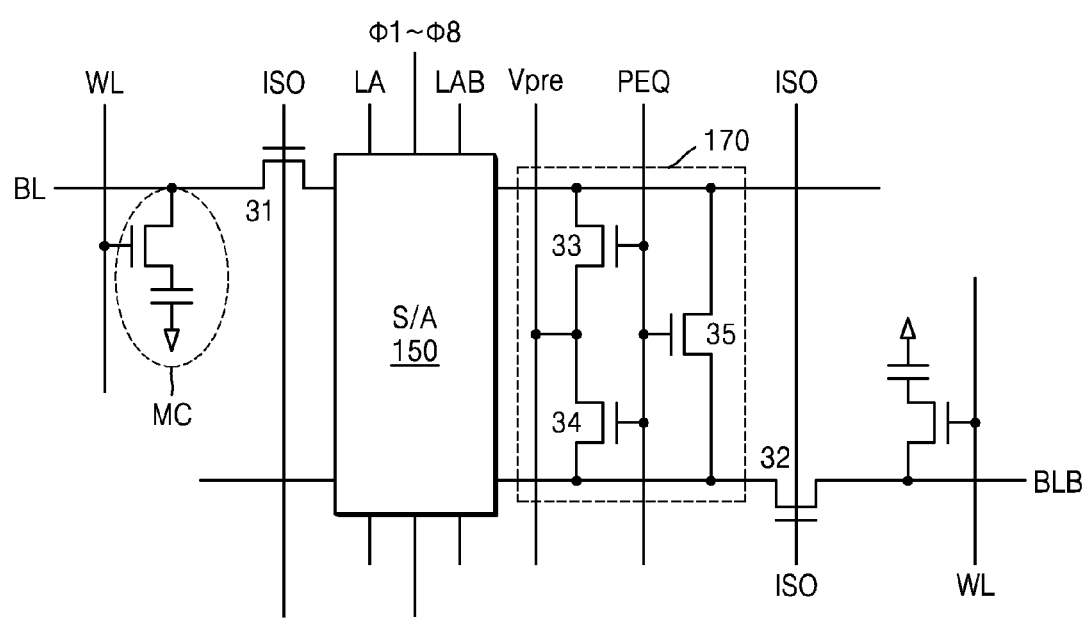
FIG. 3 illustrates a diagram showing a circuit that includes a sense amplifier according to exemplary embodiments.

FIG. 3 illustrates a diagram showing a circuit that includes the sense amplifier 150 according to exemplary embodiments.

Referring to FIG. 3, the sense amplifier 150 is connected to isolation transistors 31 and 32 and an equalization circuit 170. The first isolation transistor 31 may connect a bit line BL to the sense amplifier 150 or disconnect a bit line BL from the sense amplifier 150, in response to an isolation signal ISO. The second isolation transistor 32 may connect a complementary bit line BLB to the sense amplifier 150 or disconnect a complementary bit line BLB from the sense amplifier 150, in a response to an isolation signal ISO.

The equalizer circuit 170 includes first through third equalizer transistors 33 through 35. The first through third equalizer transistors 35 through 35 charge a bit line BL and a complementary bit line BLB with a precharge voltage Vpre and equalizes the bit line BL and the complementary bit line BLB, in response to an equalization signal PEQ.

The sense amplifier 150 may sense a voltage difference between the bit line BL and the complementary bit lint BLB according to first and second control signals LA and LAB, and first through eighth switching signals Φ1 through Φ8.

Figure 4:
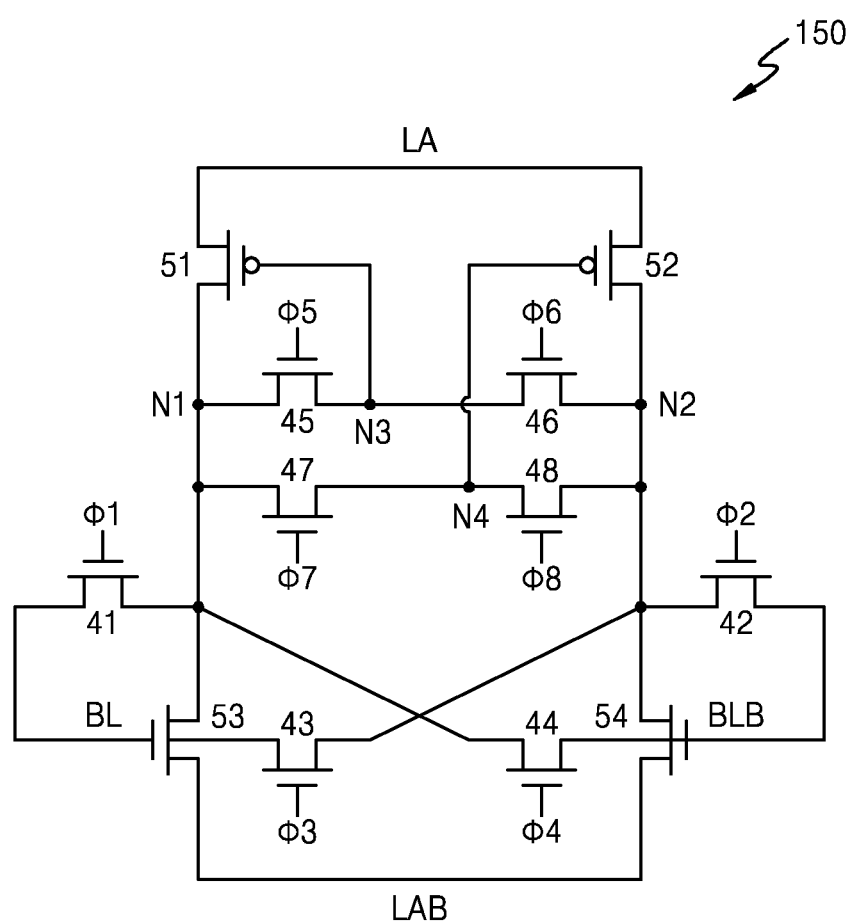
FIG. 4 illustrates a detailed circuit diagram of the sense amplifier shown in FIG. 3.

FIG. 4 illustrates a detailed circuit diagram of the sense amplifier 150 shown in FIG. 3.

Referring to FIG. 4, the sense amplifier 150 includes first and second p-channel metal-oxide semiconductor (PMOS) transistors 51 and 52, and first and second n-channel metal-oxide semiconductor (NMOS) transistors 53 and 54. Additionally, the sense amplifier 150 includes first through eighth switches 41 through 48 which are turned on/off according to the first through eighth switching signals Φ1 through Φ8. The first through eighth switches 41 through 48 may consist of NMOS transistors. The first and second PMOS transistors 51 and 52 may constitute a PMOS sense amplification unit and the first and second NMOS transistors 53 and 54 may constitute an NMOS sense amplification unit, in link with the first through eighth switches 41 through 48 which may be selectively turned on/off.

The first PMOS transistor 51 is connected between the first control signal LA and a first node N1, and a gate of the first PMOS transistor 51 is connected to a third node N3. The second PMOS transistor 52 is connected between the first control signal LA and a second node N2, and a gate of the second PMOS transistor 52 is connected to a fourth node N4.

The first NMOS transistor 53 is connected between the first node N1 and the second control signal LAB, and a gate of the first NMOS transistor 53 is connected to the bit line BL. The second NMOS transistor 54 is connected between the second node N2 and the second control signal LAB, and a gate of the second NMOS transistor 54 is connected to the complementary bit line BLB.

The first switch 41 is connected between the bit line BL and the first node N1, and operates according to the first switching signal Φ1. The second switch 42 is connected between the complementary bit line BLB and the second node N2, and operates according to the second switching signal Φ2. The third switch 43 is connected between the bit line BL and the second node N2, and operates according to the third switching signal Φ3. The fourth switch 44 is connected between the complementary bit line BLB and the first node N1, and operates according to the fourth switching signal Φ4.

The fifth switch 45 is connected between the first node N1 and the third node N3, and operates according to the fifth switching signal Φ5. The sixth switch 46 is connected between the second node N2 and the third node N3, and operates according to the sixth switching signal Φ6. The seventh switch 47 is connected between the first node N1 and the fourth node N4, and operates according to the seventh switching signal Φ7. The eighth switch 48 is connected between the second node N2 and the fourth node N4, and operates according to the eighth switching signal Φ8.

Figure 5:
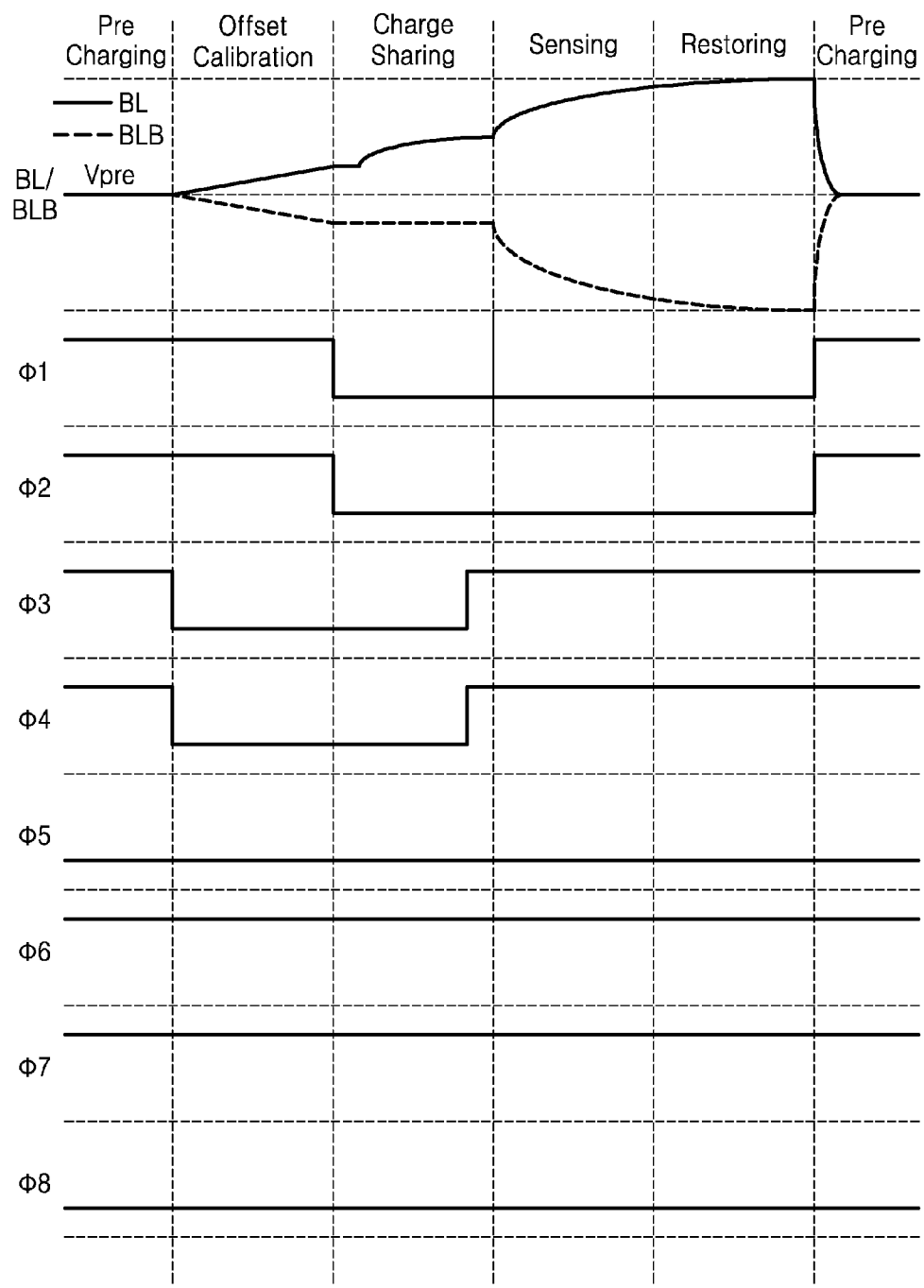
FIGS. 5 and 6A through 6D illustrate diagrams for explaining an operation of the sense amplifier, shown in FIG. 4, according to switching signals according to exemplary embodiments.
Figure 6A:
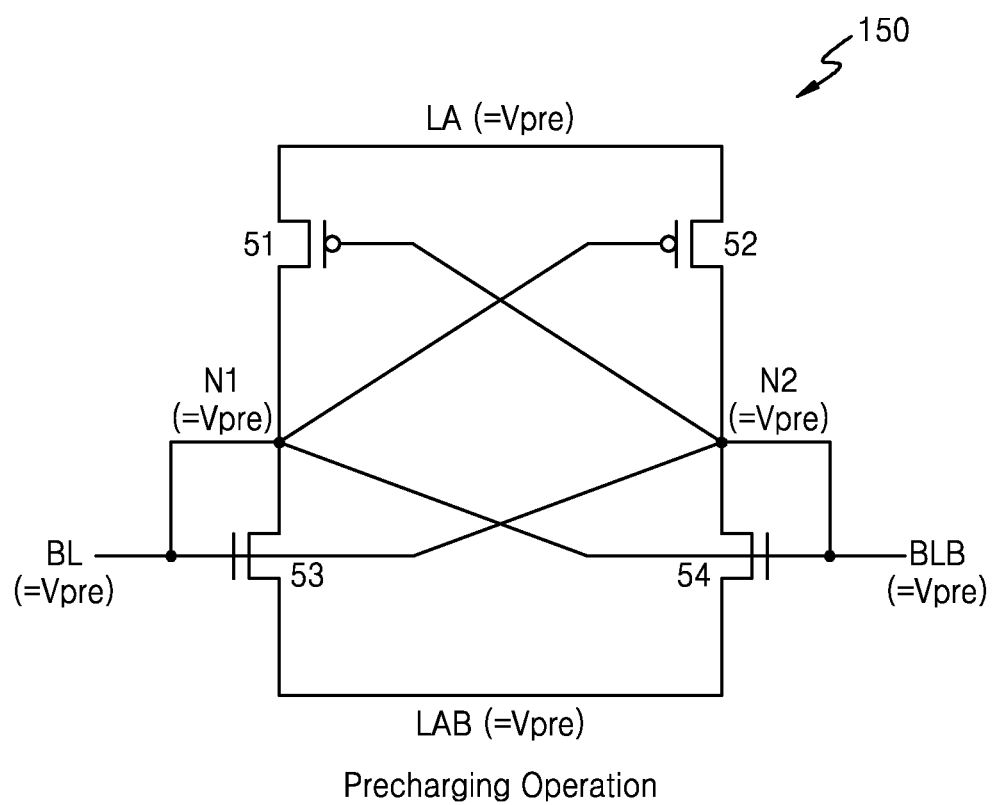
Figure 6B:
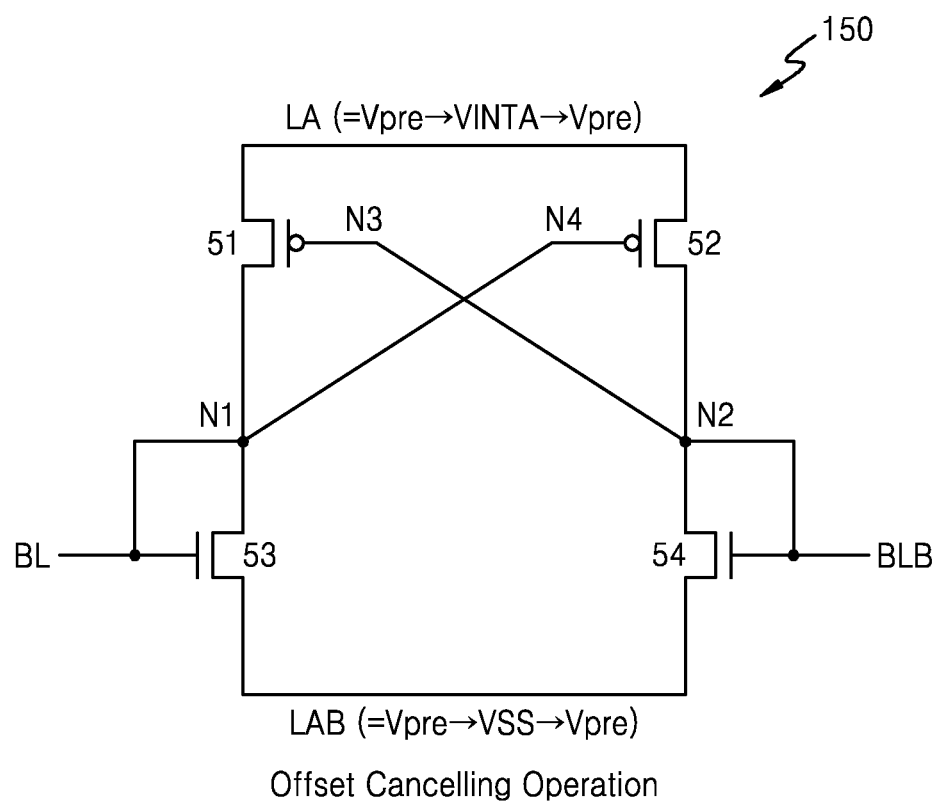
Figure 6C:
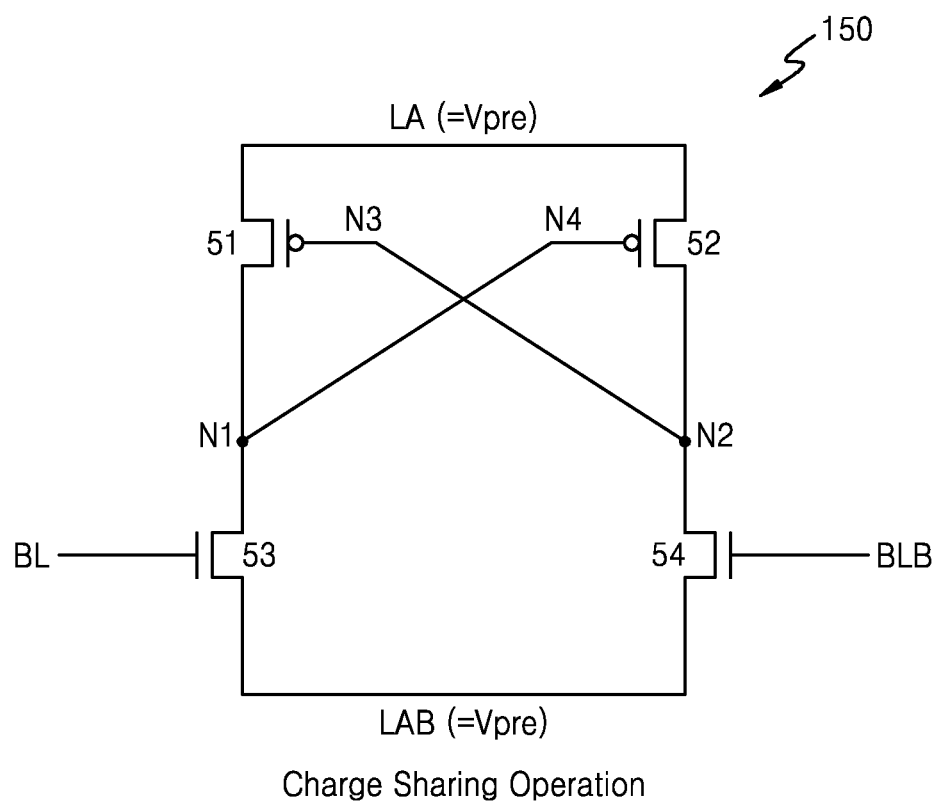
Figure 6D:
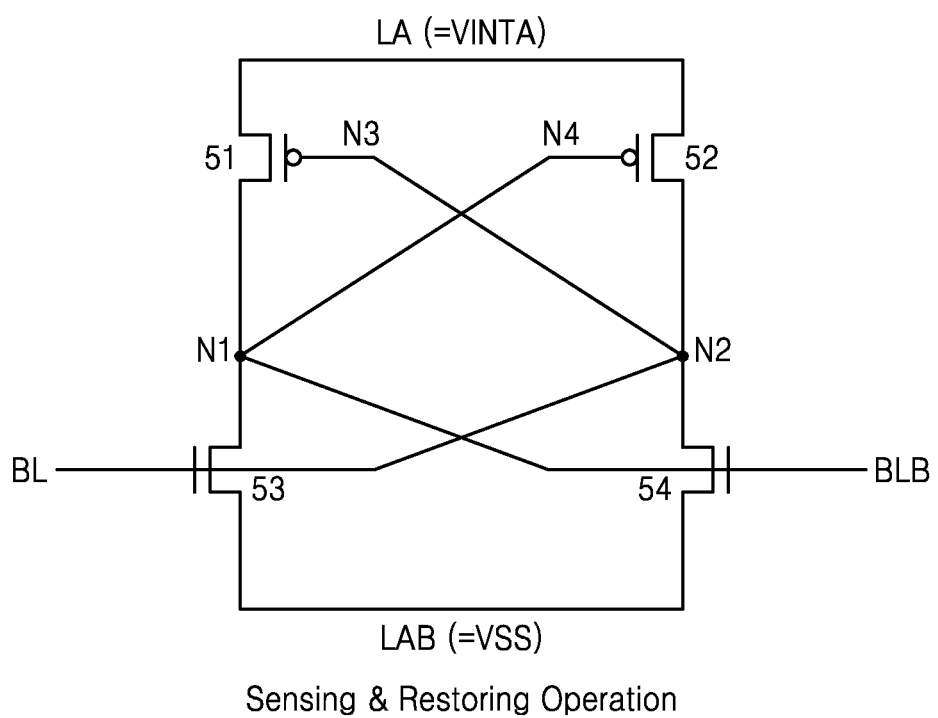

FIGS. 5 and 6A through 6D illustrate diagrams for explaining an operation of the sense amplifier 150, shown in FIG. 4, according to switching signals according to exemplary embodiments. FIG. 5 illustrates a timing diagram for explaining operations of the sense amplifier 150, and each operation with respect to FIG. 5 is described with reference to FIGS. 6A through 6D. FIG. 6A shows a diagram for explaining a precharging operation, FIG. 6B shows a diagram for explaining an offset cancellation operation, FIG. 6C shows a diagram for explaining a charge sharing operation, and FIG. 6D shows a diagram for explaining a sensing and re-storing operation.

Referring to FIGS. 4, 5, and 6A, the sense amplifier 150 performs a precharging operation. The sense amplifier 150 precharges the bit line BL and the complementary bit line BLB with a precharge voltage Vpre.

As an example, the first through fourth switching signals Φ1 through Φ4 and the sixth and seventh switching signals Φ6 and Φ7 may be logic high, and the fifth and eighth switching signals Φ5 and Φ8 may be logic low. The first through fourth switches 41 through 44 and the sixth and seventh switches 46 and 47 are turned on. Accordingly, the bit line BL and the complementary bit line BLB may be connected to each other via a node, and charged with a precharge voltage Vpre. The first and second control signals LA and LAB may be charged with the precharge voltage Vpre.

Referring to FIGS. 4, 5, and 6B, the sense amplifier 150 performs an offset cancellation operation.

As an example, the first and second switching signals Φ1 and Φ2 and the sixth and seventh switching signals Φ6 and Φ7 may be logic high, and the third through fifth and eighth switching signals Φ3 through Φ5 and Φ8 may be logic low. The first and second switches 41 and 42 and the sixth and seventh switches 46 and 47 may be turned on. Accordingly, the bit line BL and the first and fourth nodes N1 and N4 are connected to each other via a node, and the complementary bit line BLB and the second and third nodes N2 and N3 are connected to each other via a node.

The first control signal LA transits from a precharge voltage Vpre to an internal power voltage VINTA, and the second control signal LAB transits from the precharge voltage Vpre to a ground voltage VSS. The internal power voltage VINTA may be a voltage supplied to the memory cell array 110 shown in FIG. 1. Then, the first control signal LA may transit from the internal power voltage VINTA to the precharge voltage Vpre, and the second control signal LAB may transit from the ground voltage VSS to the precharge voltage Vpre.

In the sense amplifier 150, a threshold voltage Vth of the first NMOS transistor 53 may be different from a threshold voltage Vth of the second NMOS transistor 54 due to process, voltage, or temperature variation (PVT), or the like. In this case, offset noise may occur in the sense amplifier 150 due to a difference between the threshold voltage Vth of the first NMOS transistor 53 and the threshold voltage Vth of the second NMOS transistor 54. Alternately, offset noise may occur in the sense amplifier 150 due to a difference between the threshold voltage Vth of the first PMOS transistor 51 and the threshold voltage Vth of the second PMOS transistor 52. Hereinafter, a method of compensating for offset of the sense amplifier 150 by performing an offset cancellation operation is described with reference to first through fourth examples.

Figure 15:
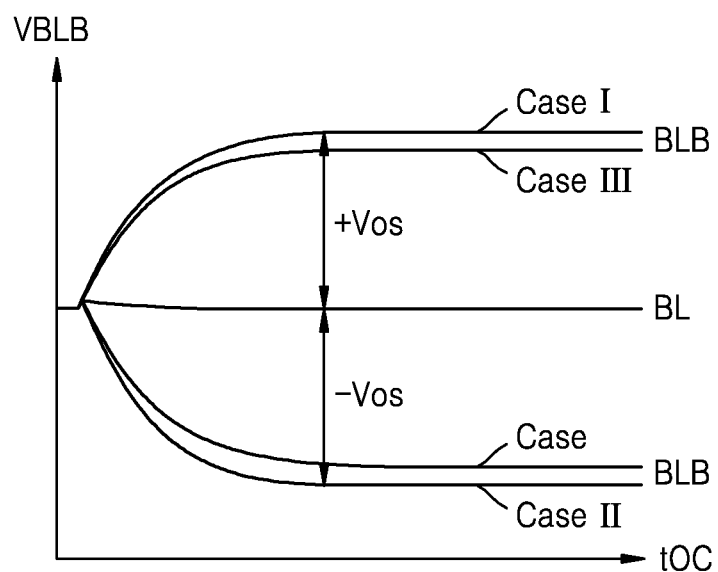
FIGS. 15 through 17 illustrate diagrams for explaining an effect of an offset cancellation operation according to exemplary embodiments.

As the first example (in Case I), it is assumed that a threshold voltage Vth of the first NMOS transistor 53 is higher than a threshold voltage Vth of the second NMOS transistor 54. The first and second NMOS transistor 53 and 54 operate as diodes. Current flowing via the first NMOS transistor 53 may be smaller than current flowing via the second NMOS transistor 54. Current flowing via the first PMOS transistor 51 may be greater than current flowing via the second PMOS transistor 52. Accordingly, a level of the complementary bit line BLB may increase to a certain level when compared to the bit line BL, as shown in FIG. 15.

As the second example (in Case II), it is assumed that a threshold voltage Vth of the second NMOS transistor 54 is higher than a threshold voltage Vth of the first NMOS transistor 53. The first and second NMOS transistor 53 and 54 operate as diodes. Current flowing via the second NMOS transistor 54 may be smaller than current flowing via the first NMOS transistor 53. Current flowing via the second PMOS transistor 52 may be greater than current flowing via the first PMOS transistor 51. Accordingly, a level of the complementary bit line BLB may decrease to a certain level when compared to the bit line BL, as shown in FIG. 15.

As the third example (in Case III), it is assumed that a threshold voltage Vth of the first PMOS transistor 51 is higher than a threshold voltage Vth of the second PMOS transistor 52. Current flowing via the first PMOS transistor 51 may be smaller than current flowing via the second PMOS transistor 52. The first and second NMOS transistors 53 and 54 may provide certain current to the bit line BL and the complementary bit line BLB as diodes. Accordingly, a level of the complementary bit line BLB may increase to a certain level when compared to the bit line BL, as shown in FIG. 15.

As the fourth example (in Case IV), it is assumed that a threshold voltage Vth of the second PMOS transistor 52 is higher than a threshold voltage Vth of the first PMOS transistor 51. Current flowing via the second PMOS transistor 52 may be smaller than current flowing via the first PMOS transistor 51. The first and second NMOS transistors 53 and 54 may provide a certain current to the bit line BL and the complementary bit line BLB as diodes. Accordingly, a level of the complementary bit line BLB may decrease to a certain level when compared to the bit line BL, as shown in FIG. 15.

As described with reference to the first through fourth examples, the voltage of the complementary bit line BLB increases or decreases corresponding to a voltage level of the bit line BL, and a voltage difference between the bit line BL and the complementary bit line BLB may be present. The voltage difference may be interpreted as an offset voltage caused by offset noise. The voltage difference indicates that the bit line BL and the complementary bit line BLB are developed as having a voltage difference therebetween corresponding to an offset voltage, and thus, offset noise of the sense amplifier 150 is cancelled. In other words, the sense amplifier 150 may compensate for offset by performing an offset cancellation operation.

Referring to FIGS. 4, 5, and 6C, the sense amplifier 150 performs a charge sharing operation.

As an example, the sixth and seventh switching signals Φ6 and Φ7 may be logic high, and the first through fifth switching signals Φ1 through Φ5 and the eighth switching signal Φ8 may be logic low. Accordingly, the sixth and seventh switches 46 through 47 may be turned on. Thus, the first and fourth nodes N1 and N4 are connected to each other via a node, and the second and third nodes N2 and N3 are connected to each other via a node. A word line WL connected to the memory cell MC shown in FIG. 3 is activated, and charge sharing occurs between electric charges stored in a cell capacitor included in the memory cell MC and electric charges stored in the bit line BL.

For example, if data '1' is stored in the memory cell MC, when a charge sharing operation is performed, a voltage level of the bit line BL may increase in correspondence with a certain level. Conversely, if data '0' is stored in the memory cell MC, when a charge sharing operation is performed, a voltage level of the bit line BL may decrease in correspondence with a certain level.

Referring to FIGS. 4, 5, and 6D, the sense amplifier 150 performs a sensing and re-storing operation.

As an example, the third and fourth switching signals Φ3 and Φ4 and the sixth and seventh switching signals Φ6 and Φ7 may be logic high, and the first, second, fifth, and eighth switching signals Φ1, Φ2, Φ5, and Φ8 may be logic low. The sense amplifier 150 may include a configuration of a circuit in which the first and second PMOS transistors 51 and 52 and the first and second NMOS transistors 53 and 54 are cross-coupled with the first and second nodes N1 and N2. The first and second nodes N1 and N2 are respectively connected to the complementary bit line BLB and the bit line BL. The sense amplifier 150 may perform a sensing operation of sensing and amplifying a voltage difference between the bit line BL and the complementary bit line BLB.

For example, if data '1' is stored in the memory cell MC, a voltage of the bit line BL may increase to an internal power voltage VINTA, and a voltage of the complementary bit line BLB may decrease to a ground voltage VSS. Conversely, if data '0' is stored in the memory cell MC, a voltage of the bit line BL may decrease to a ground voltage VSS, and a voltage of the complementary bit line BLB may increase to an internal power voltage VINTA.

The voltage difference sensed and amplified by the sense amplifier 150 develops the bit line BL and the complementary bit line BLB to the internal power voltage VINTA or the ground voltage VSS. After the sensing operation is performed, a re-storing operation of storing the bit line BL or the complementary bit line BLB voltage, developed to the internal power voltage VINTA or the ground voltage VSS, in a memory cell may be performed. Or, the bit line BL and the complementary bit line BLB which are developed to the internal power voltage VINTA or the ground voltage VSS may be connected to a data line, and then, output to a local sense amplifier, a global sense amplifier, or the data input/output circuit 160 shown in FIG. 1 via the data line.

Figure 7:
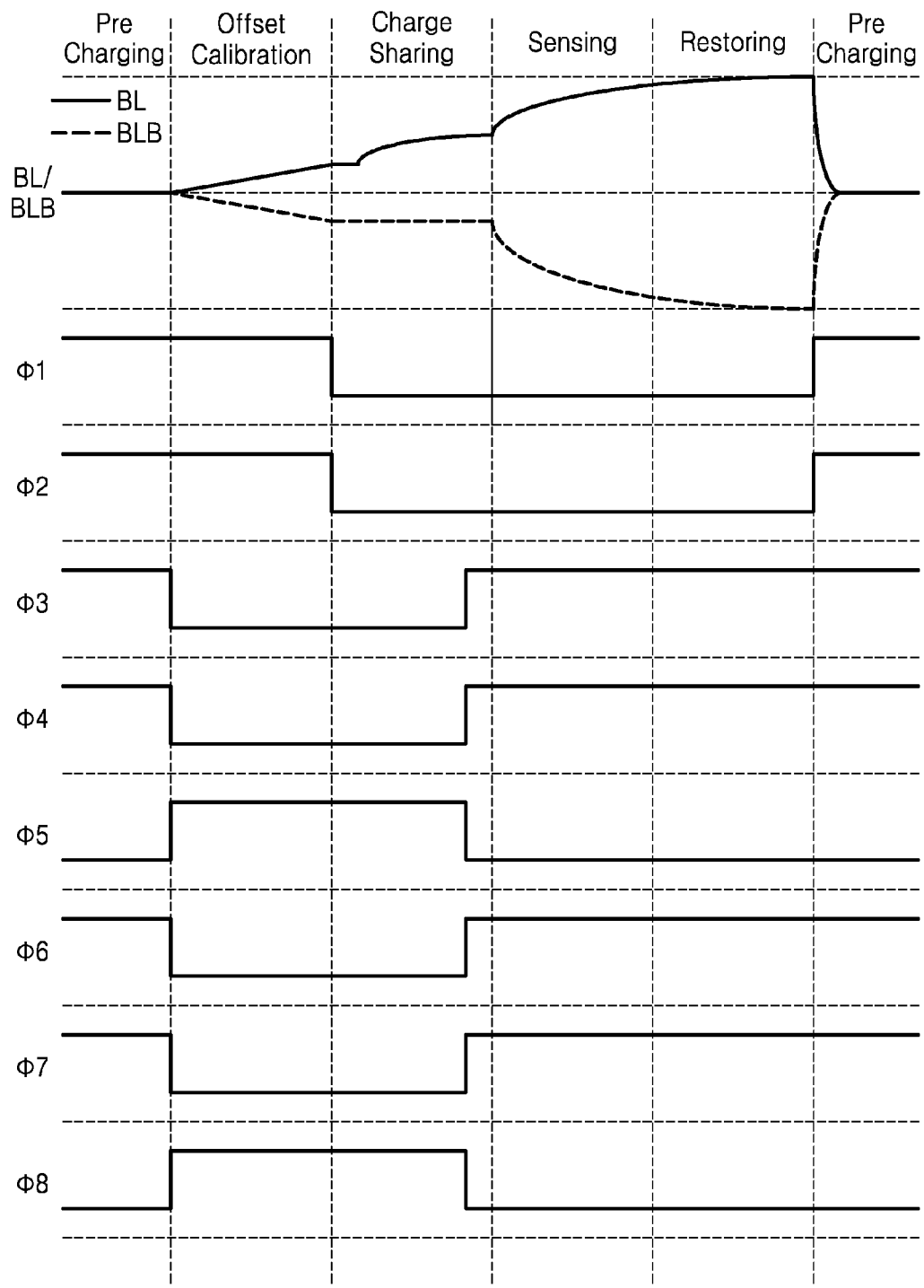
FIGS. 7, 8A and 8B illustrate diagrams for explaining an operation of the sense amplifier, shown in FIG. 4, according to switching signals according to exemplary embodiments.
Figure 8A:
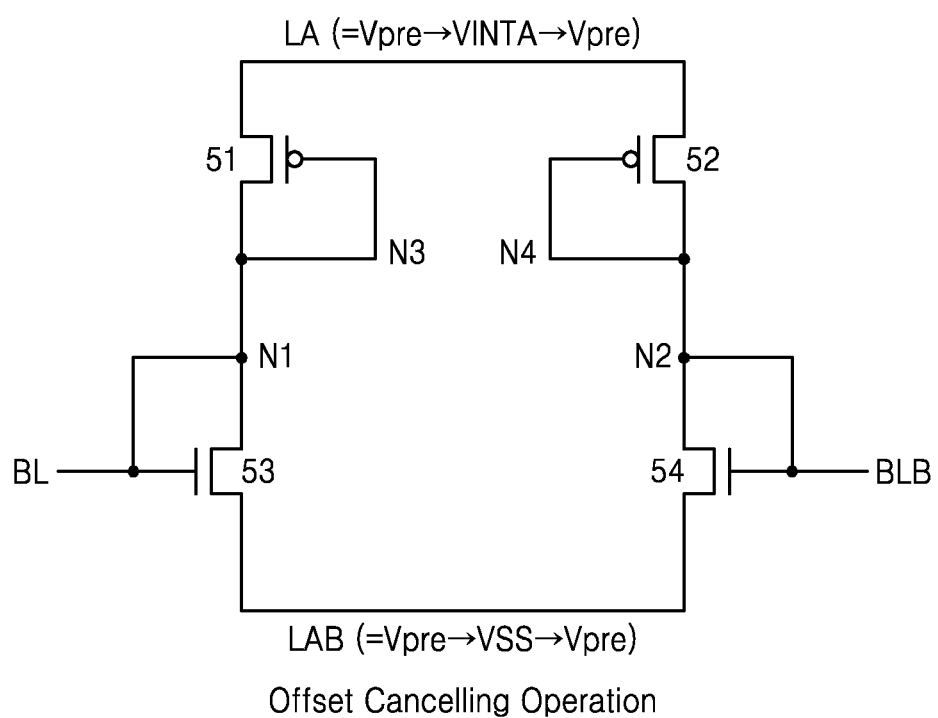
Figure 8B:
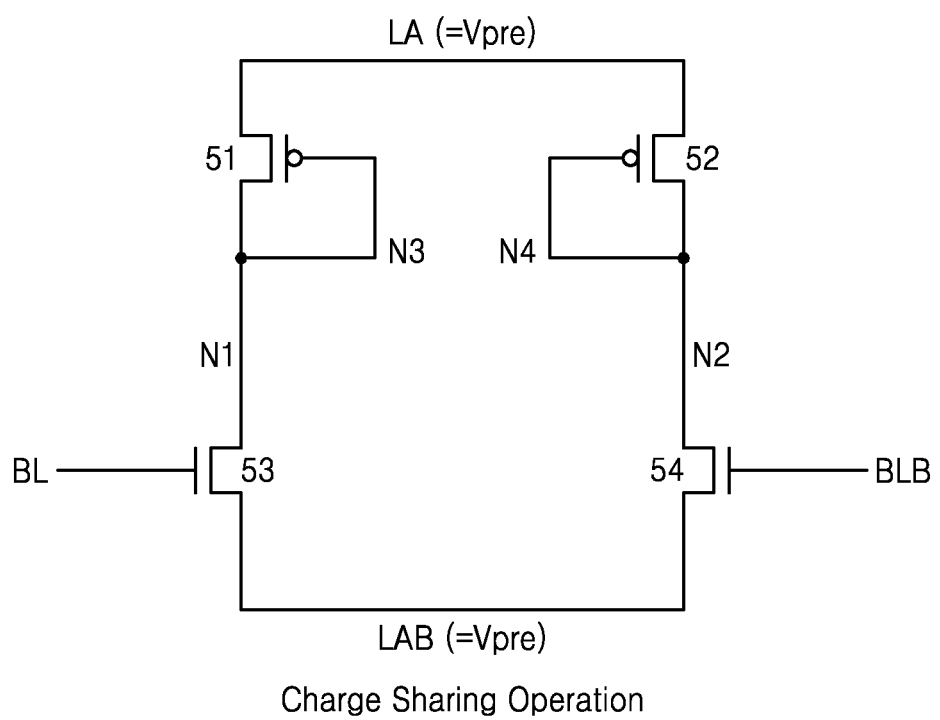

FIGS. 7 and 8A and 8B illustrate diagrams for explaining an operation of the sense amplifier 150 shown in FIG. 4, according to switching signals according to exemplary embodiments. First through eighth switching signals Φ1 through Φ8 with respect to an offset cancellation operation and a charge sharing operation, shown in a timing diagram in FIG. 7, are different from those in FIG. 5. The offset cancellation operation and the charge sharing operation are described with reference to FIGS. 8A and 8B.

Referring to FIGS. 4 and 7, the sense amplifier 150 precharges the bit line BL and the complementary bit line BLB with a precharge voltage Vpre, as described with reference to FIGS. 5 and 6A. If the first through fourth switching signals Φ1 through Φ4 and the sixth and seventh switching signals Φ6 and Φ7 are logic high, and the fifth and eighth switching signals Φ5 and Φ8 are logic low, the first through fourth switches 41 through 44 and the sixth and seventh switches 46 and 47 are turned on, and the bit line BL and the complementary bit line BLB may be connected to each other via a node, and charged with a precharge voltage Vpre.

Referring to FIGS. 4, 7, and 8A, the sense amplifier 150 performs an offset cancellation operation.

As an example, the first and second switching signals Φ1 and Φ2 and the fifth and eighth switching signals Φ5 and Φ8 may be logic high, and the third, fourth, sixth, and seventh switching signals Φ3, Φ4, Φ6, and Φ7 may be logic low. The first and second switches 41 and 42 and the fifth and eighth switches 45 and 48 are turned on. Accordingly, the bit line BL and the first and third nodes N1 and N3 are connected to each other via a node, and the complementary bit line BLB and the second and fourth nodes N2 and N4 are connected to each other via a node.

The first control signal LA transits from a precharge voltage Vpre to an internal power voltage VINTA, and the second control signal LAB transits from the precharge voltage Vpre to a ground voltage VSS. Then, the first control signal LA may transit from the internal power voltage VINTA to the precharge voltage Vpre, and the second control signal LAB may transit from the ground voltage VSS to the precharge voltage Vpre.

In the sense amplifier 150, threshold voltages Vth of the first and second PMOS transistors 51 and 52 and the first and second NMOS transistor 53 and 54 may be different from each other due to PVT, or the like. Since the sense amplifier 150 operates such that a voltage level of the complementary bit line BLB increases or decreases to a certain level when compared to a voltage level of the bit line BL based on a threshold voltage difference between the first through fourth transistors 51 through 54, a voltage difference between the bit line BL and the complementary bit line BLB may be present. A voltage of the bit line BL and a voltage of the complementary bit line BLB are developed as having a voltage difference therebetween corresponding to an offset voltage, and thus, the sense amplifier 150 may compensate for the offset by performing an offset cancellation operation.

Referring to FIGS. 4, 7, and 8B, the sense amplifier 150 performs a charge sharing operation.

As an example, the fifth and eighth switching signals Φ5 and Φ8 may be logic high, and the first through fourth switching signals Φ1 through Φ4 and the sixth and seventh switching signals Φ6 and Φ7 may be logic low. Accordingly, the first and third nodes N1 and N3 are connected to each other via a node, and the second and fourth nodes N2 and N4 are connected to each other via a node. A word line WL connected to the memory cell MC shown in FIG. 3 is activated, and charge sharing between electric charges stored in a cell capacitor included in the memory cell MC and electric charges stored in the bit line BL occurs.

For example, if data '1' is stored in the memory cell MC, when a charge sharing operation is performed, a voltage level of the bit line BL may increase in correspondence with a certain level. Conversely, if data '0' is stored in the memory cell MC, when a charge sharing operation is performed, a voltage level of the bit line BL may decrease in correspondence with a certain level.

Referring to FIGS. 4 and 7, the sense amplifier 150 performs a sensing and re-storing operation as described with reference to FIGS. 5 and 6D. If the third and fourth switching signals Φ3 and Φ4 and the sixth and seventh switching signals Φ6 and Φ7 are logic high, and the first, second, fifth, and eighth switching signals Φ1, Φ2, Φ5, and Φ8 are logic low, the sense amplifier 150 may include a configuration of a circuit in which the first and second PMOS transistors 51 and 52 and the first and second NMOS transistors 53 and 54 are cross-coupled with the complementary bit line BLB and the bit line BLB and sense and amplify a voltage difference between the bit line BL and the complementary bit line BLB.

Figure 9:
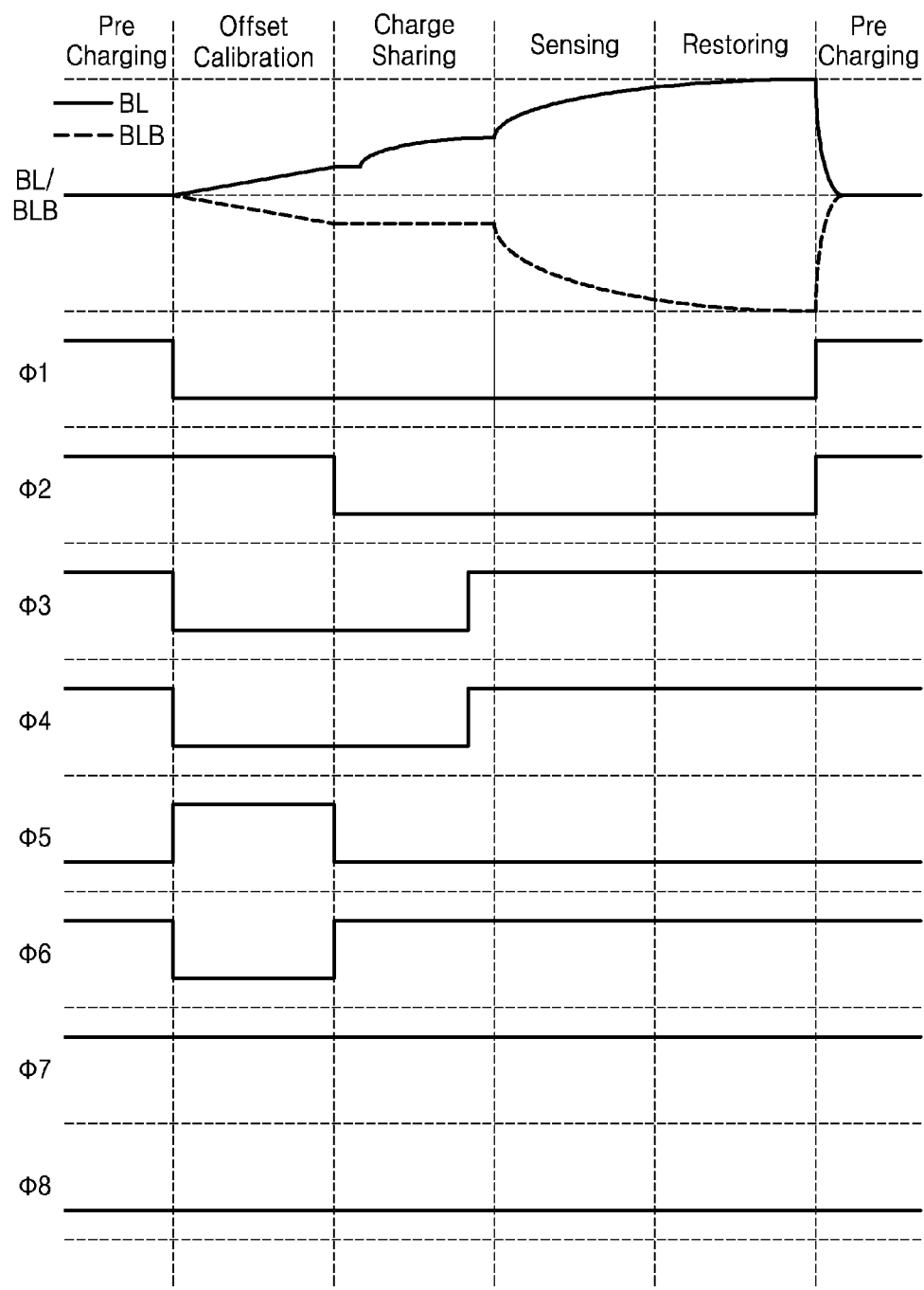
FIGS. 9 and 10 illustrate diagrams for explaining an operation of the sense amplifier, shown in FIG. 4, according to switching signals according to exemplary embodiments.
Figure 10:
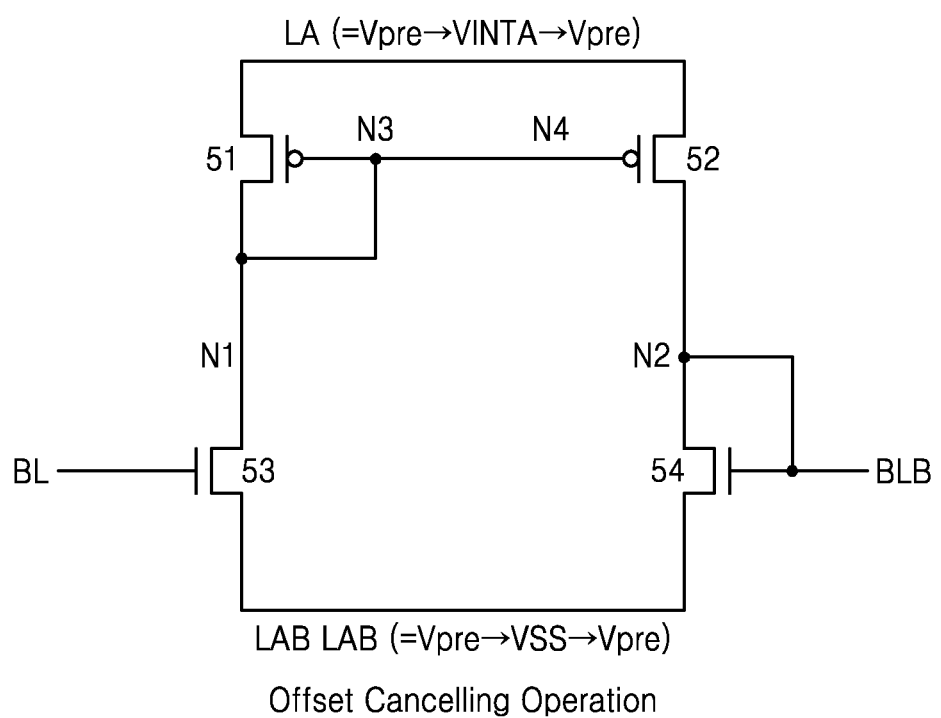

FIGS. 9 and 10 are diagrams for explaining an operation of the sense amplifier 150 shown in FIG. 4, according to switching signals according to exemplary embodiments. The timing diagram shown in FIG. 9 may be appropriately used to read data in a memory cell MC connected to a bit line BL. In the timing diagram shown in FIG. 9, first through eighth switching signals Φ1 through Φ8 with respect to an offset cancellation operation are different from those in FIG. 5. The offset cancellation operation is described with reference to FIG. 10. The precharging operation described with reference to FIGS. 4 and 9 is identical to that described with reference to FIG. 6A, the charge sharing operation described with reference to FIGS. 4 and 9 is identical to that described with reference to FIG. 6C, and the sensing and re-storing operation described with reference to FIGS. 4 and 9 is identical to that described with reference to FIG. 6D. Thus, a repeated description thereof is not provided herein.

Referring to FIGS. 4, 9, and 10, the sense amplifier 150 performs an offset cancellation operation.

As an example, second, fifth, and seventh switching signals Φ2, Φ5, and Φ7 may be logic high, and first, third, fourth, and eighth switching signals Φ1, Φ3, Φ4, Φ6, and Φ8 may be logic low. The second, fifth, seventh switches 42, 45, and 47 are turned on. Accordingly, the complementary bit line BLB and the second node N2 are connected to each other via a node, and the first, third, and fourth nodes N1, N3, and N4 are connected to each other via a node.

The first control signal LA transits from a precharge voltage Vpre to an internal power voltage VINTA, and the second control signal LAB transits from the precharge voltage Vpre to a ground voltage VSS. Then, the first control signal LA transits from the internal power voltage VINTA to the precharge voltage Vpre, and the second control signal LAB transits from the ground voltage VSS to the precharge voltage Vpre.

In the sense amplifier 150, threshold voltages Vth of the first and second PMOS transistors 51 and 52 and the first and second NMOS transistor 53 and 54 may be different from each other due to a PVT, or the like. Since the sense amplifier 150 operates so that a voltage level of the complementary bit line BLB increases or decreases to a certain level when compared to a voltage level of the bit line BL based on a threshold voltage difference between the first through fourth transistors 51 through 54, a certain voltage difference between the bit line BL and the complementary bit line BLB may be present. A voltage of the bit line BL and a voltage of the complementary bit line BLB are developed as having a voltage difference therebetween in correspondence with an offset voltage, and thus, the sense amplifier 150 may compensate for offset by performing an offset cancellation operation.

Figure 11:
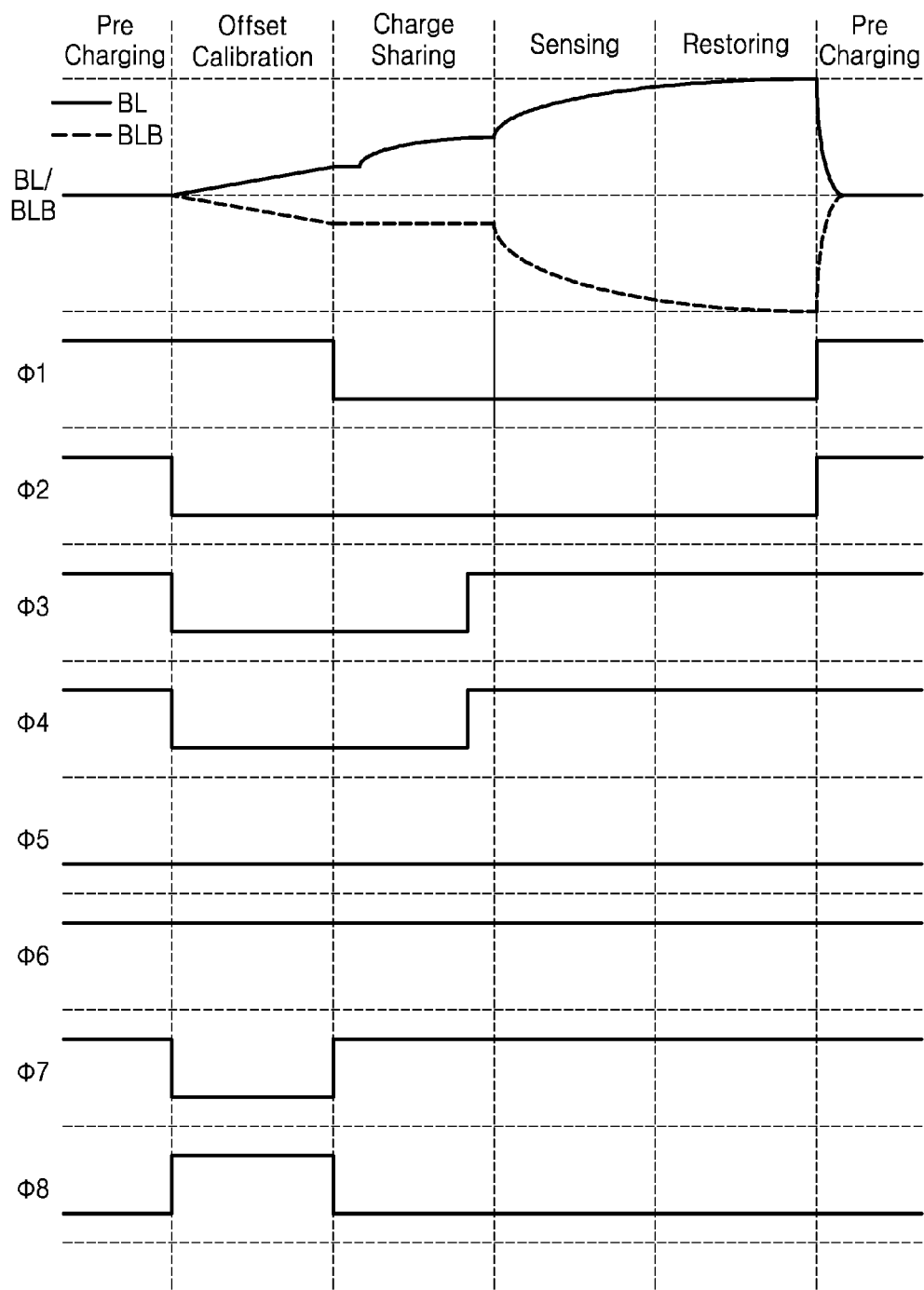
FIGS. 11 and 12 illustrate diagrams for explaining an operation of the sense amplifier, shown in FIG. 4, according to switching signals according to exemplary embodiments.
Figure 12:
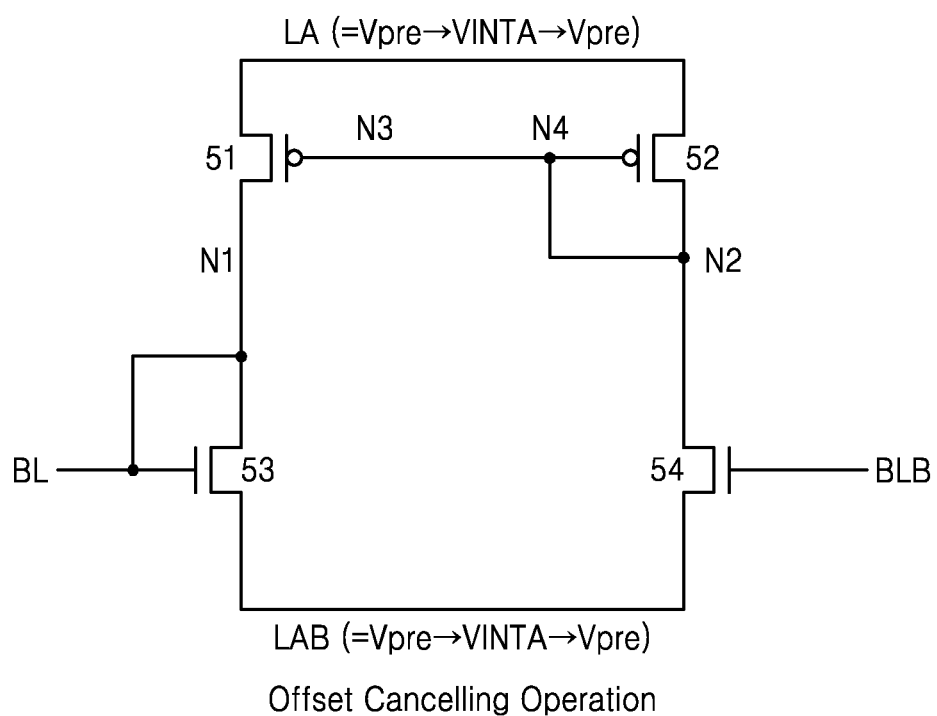

FIGS. 11 and 12 illustrate diagrams for explaining an operation of the sense amplifier 150, shown in FIG. 4, according to switching signals according to exemplary embodiments. A timing diagram shown in FIG. 11 may be appropriate to read data in a memory cell MC connected to a complementary bit line BLB. First through eighth switching signals Φ1 through Φ8 with respect to an offset cancellation operation, shown in the timing diagram shown in FIG. 11, are different from those in FIG. 5. The offset cancellation operation is described with reference to FIG. 12. The precharging operation described with reference to FIGS. 4 and 11 is identical to that described with reference to FIG. 6A, the charge sharing operation described with reference to FIGS. 4 and 11 is identical to that described with reference to FIG. 6C, and the sensing and re-storing operation described with reference to FIGS. 4 and 11 is identical to that described with reference to FIG. 6D. Thus, a description thereof is not provided here again.

Referring to FIGS. 4, 11, and 12, the sense amplifier 150 performs an offset cancellation operation.

As an example, first, sixth, and eighth switching signals Φ1, Φ6, and Φ8 may be logic high, and second through fifth and eighth switching signals Φ2 through Φ5 and Φ7 may be logic low. The first, sixth, and eighth switches 41, 46, 48 are turned on. Accordingly, the bit line BL and the first node N1 are connected to each other via a node, and the second, third, and fourth nodes N2, N3, and N4 are connected to each other via a node.

The first control signal LA transits from a precharge voltage Vpre to an internal power voltage VINTA, and the second control signal LAB transits from the precharge voltage Vpre to a ground voltage VSS. Then, the first control signal LA may transit from the internal power voltage VINTA to the precharge voltage Vpre, and the second control signal LAB may transit from the ground voltage VSS to the precharge voltage Vpre.

In the sense amplifier 150, threshold voltages Vth of the first and second PMOS transistors 51 and 52 and the first and second NMOS transistor 53 and 54 may be different from each other due to a PVT, or the like. Since the sense amplifier 150 operates so that a voltage level of the complementary bit line BLB increases or decreases to a certain level when compared to a voltage level of the bit line BL based on a threshold voltage difference between the first through fourth transistors 51 through 54, a certain voltage difference between the bit line BL and the complementary bit line BLB may be present. A voltage of the bit line BL and a voltage of the complementary bit line BLB are developed as having a voltage difference therebetween in correspondence with an offset voltage, and thus, the sense amplifier 150 may compensate for offset by performing an offset cancellation operation.

Figure 13:
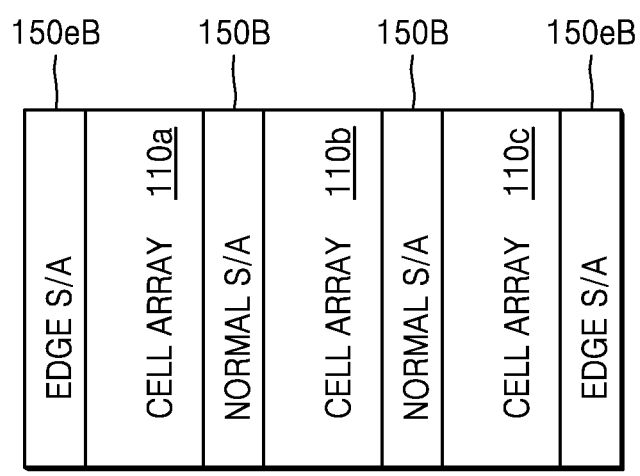
FIGS. 13 and 14 illustrate diagrams for explaining a core area in a memory apparatus according to exemplary embodiments.
Figure 14:
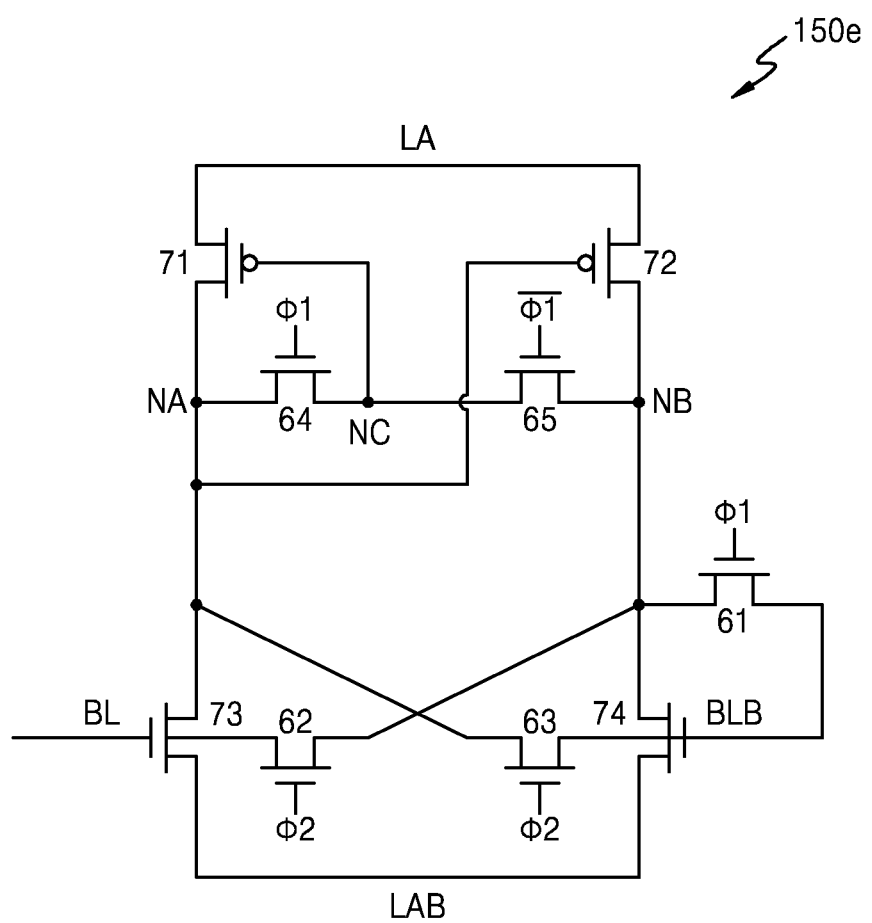

FIGS. 13 and 14 illustrate diagrams for explaining a core area in a memory apparatus according to exemplary embodiments. FIG. 13 is a block diagram of sense amplifier blocks connected to the memory cell array 110 shown in FIG. 1. FIG. 14 is a circuit diagram for explaining a sense amplifier included in edge sense amplifier blocks 150eB shown in FIG. 13.

Referring to FIG. 13, the memory cell array 110 shown in FIG. 1 consists of a plurality of sub-cell arrays 110a through 110c. Core areas of the memory apparatus 100 (shown in FIG. 1), in which normal sense amplifier blocks 150B are disposed, are shown between the sub-cell arrays 110a through 110c. The normal sense amplifier blocks 150B have an open bit line structure, include the sense amplifier 150 shown in FIG. 4, and sense and amplify memory cells in sub-cell arrays 110a through 110c adjacent to the normal sense amplifier blocks 150B.

The sub-cell arrays 110a and 110c respectively disposed in an outer edge of the memory cell array 110 are connected to the edge sense amplifier blocks 150eB. An end of the edge sense amplifier blocks 150eB is connected to the sub-cell array 110a or 110c, and the other end of the edge sense amplifier blocks 150eB is not connected to any sub-cell array block. The edge sense amplifier block 150eB may consist of a sense amplifier 150e shown in FIG. 14.

Referring to FIG. 14, the sense amplifier 150e includes first and second PMOS transistors 71 and 72, and first and second NMOS transistors 73 and 74. Additionally, the sense amplifier 150e includes first through fifth switches 61 through 65 which are turned on/off according to first and second signals Φ1 and Φ2. The first through fifth switches 61 through 65 may consist of NMOS transistors. The first and second PMOS transistors 71 and 72 may constitute a PMOS sensor amplification unit and the first and second NMOS transistors 73 and 74 may constitute an NMOS sense amplification unit, in connection with the first through fifth switches 61 through 65 which are selectively turned on/off in response to first and second signals Φ1 and Φ2.

The first PMOS transistor 71 is connected between a first control signal LA and a first node NA, and a gate of the first PMOS transistor 71 is connected to a third node NC. The second PMOS transistor 72 is connected between the first control signal LA and a second node NB, and a gate of the second PMOS transistor 72 is connected to the first node NA.

The first NMOS transistor 73 is connected between the first node NA and a second control signal LAB, and a gate of the first NMOS transistor 73 is connected to the bit line BL. The second NMOS transistor 74 is connected between the second node NB and the second control signal LAB, and a gate of the second NMOS transistor 74 is connected to the complementary bit line BLB.

The first switch 61 is connected between the complementary bit line BLB and the second node NB, and operates according to the first switching signal Φ1. The second switch 62 is connected between the bit line BL and the second node NB, and operates according to the second switching signal Φ2. The third switch 63 is connected between the complementary bit line BLB and the first node NA, and operates according to the second switching signal Φ2. The fourth switch 64 is connected between the first node NA and the third node NC, and operates according to the first switching signal Φ1. The fifth switch 65 is connected between the second node NB and the third node NC, and operates according to a reverse signal (/Φ1) of the first switching signal Φ1.

The sense amplifier 150e performs an offset cancellation operation by using a configuration of a circuit, described above with reference to FIG. 10, in response to a logic high of the first switching signal Φ1. In the sense amplifier 150e, the complementary bit line BLB and the second node NB are connected to each other via a node, and the first and third nodes NA and NC are connected to each other via a node.

In the sense amplifier 150e, threshold voltages Vth of the first and second PMOS transistors 71 and 72 and the first and second NMOS transistor 73 and 74 may be different from each other due to PVT, or the like. Since the sense amplifier 150e operates so that a voltage level of the complementary bit line BLB increases or decreases to a certain level when compared to a voltage level of the bit line BL based on a threshold voltage difference between the first through fourth transistors 71 through 74, an offset voltage difference between the bit line BL and the complementary bit line BLB may be present. An offset voltage between the bit line BL and the complementary bit line BLB is developed, and thus, the sense amplifier 150e may compensate for offset by performing an offset cancellation operation.

Figure 16:
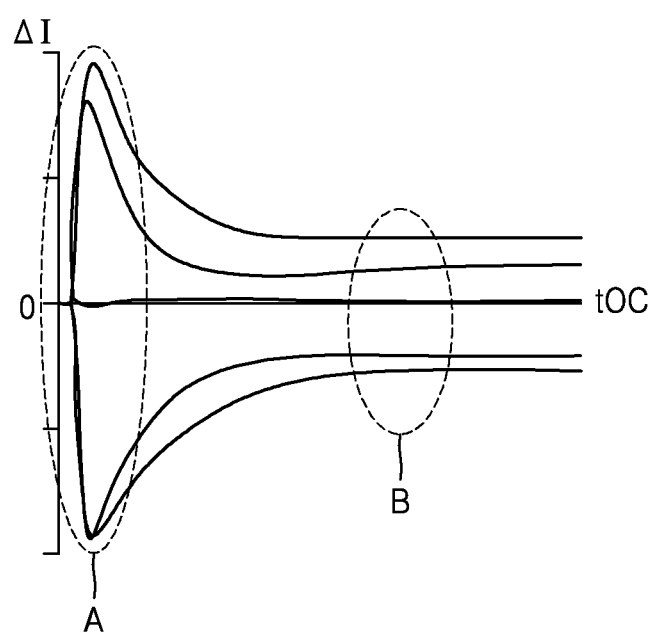
Figure 17:
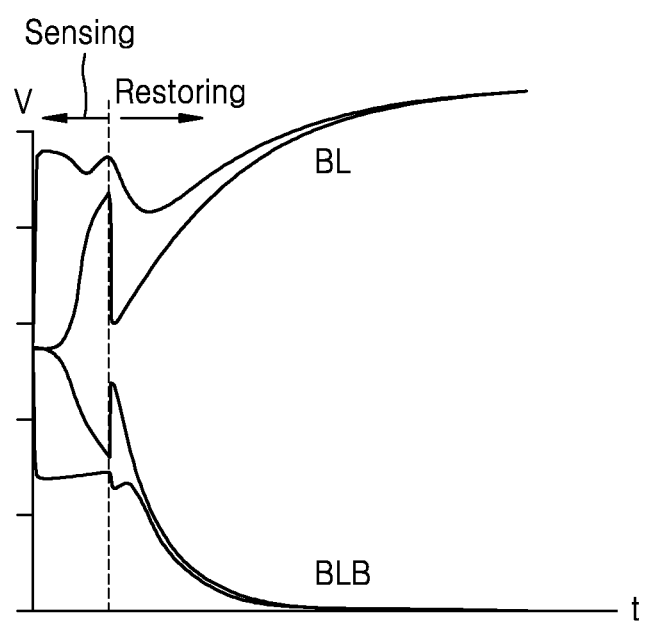

FIGS. 15 through 17 illustrate diagrams for explaining an effect of an offset cancellation operation according to exemplary embodiments.

Referring to FIG. 15, it may be understood that a voltage level of a complementary bit line BLB increases or decreases in correspondence with an offset voltage Vos compared to a voltage level of a bit line BL, as the sense amplifier 150 shown in FIG. 4 or the sense amplifier 150e shown in FIG. 14 performs an offset cancellation operation.

Referring to FIG. 16, before the sense amplifier 150 shown in FIG. 4 or the sense amplifier 150e shown in FIG. 14 performs an offset cancellation operation, a difference between the current at the first node N1 or NA and the current at the second node N2 or NB is large, as illustrated in area A of FIG. 16. Then, after an offset cancellation operation is performed according to operation of switches that are selectively turned on/off, the difference therebetween is reduced, as shown in area B.

Referring to FIG. 17, it may be understood that the bit line BL and the complementary bit lint BLB voltages are sufficiently developed as the sense amplifier 150 shown in FIG. 4 or the sense amplifier 150e shown in FIG. 14 performs a sensing and re-storing operation with respect to the bit line BL and the complementary bit line BLB after the offset cancellation operation is performed.

Figure 18:
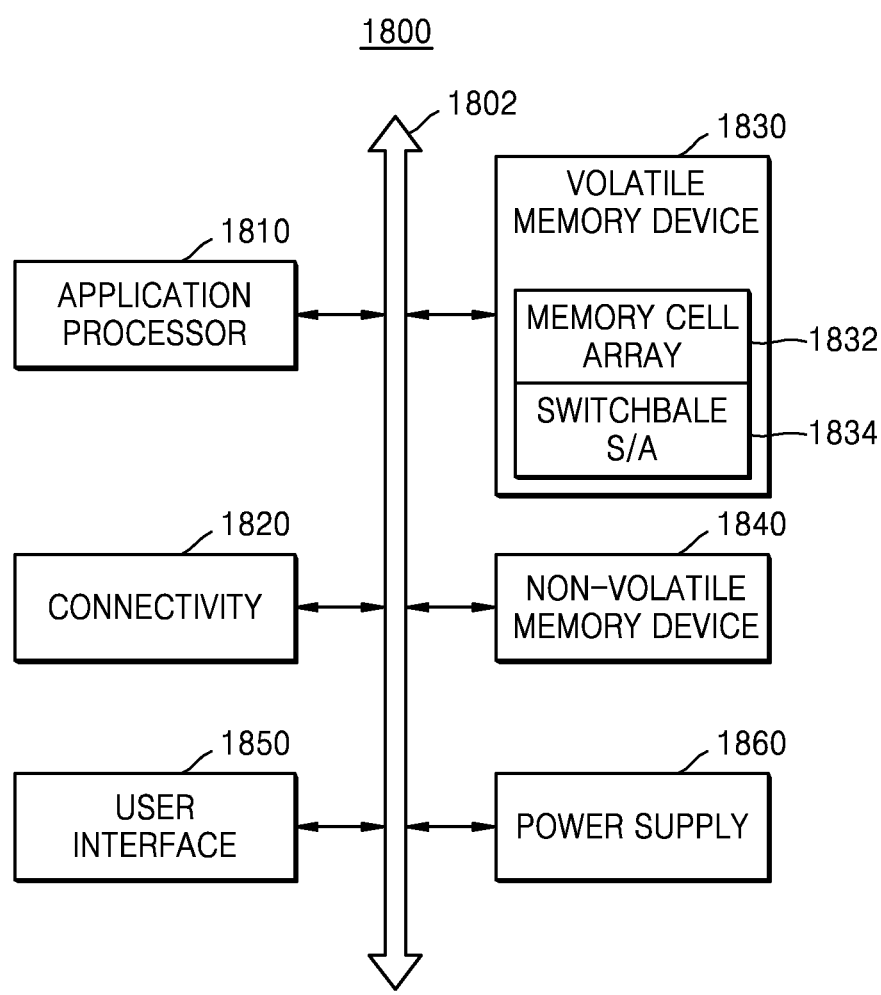
FIG. 18 is a block diagram of an example of applying a memory apparatus having a switchable sense amplifier to a mobile system, according to exemplary embodiments.

FIG. 18 is a block diagram of an example of applying memory apparatuses having a switchable sense amplifier to a mobile system 1800, according to exemplary embodiments.

Referring to FIG. 18, the mobile system 1800 may include an application processor 1810, a connectivity unit 1820, a first memory apparatus 1830, a second memory apparatus 1840, a user interface 1850, and a power supply 1860 which are connected to each other via a bus 1802. The first memory apparatus 1830 may be configured as a volatile memory apparatus, and the second memory apparatus 1840 may be configured as a non-volatile memory apparatus. According to exemplary embodiments, the mobile system 1800 may be an arbitrary mobile system such as a mobile phone, a smartphone, a personal digital assistant (PDA), a portable multimedia player (PMP), a digital camera, a music player, a portable game console, a navigation system, or the like.

The application processor 1810 may execute applications providing an internet browser, a game, a moving image, or the like. According to exemplary embodiments, the application processor 1810 may include a single core or multiple cores. For example, the application processor 1810 may be a dual-core, quad-core, or hexa-core processor. According to exemplary embodiments, the application processor 1810 may further include a cache memory located inside or outside the application processor 1810.

The connectivity unit 1820 may perform wired or wireless communication with an external apparatus. For example, the connectivity unit 1820 may perform Ethernet communication, near-field communication (NFC), radio frequency identification (RFID), mobile telecommunication, memory card communication, universal serial bus (USB) communication, or the like. For example, the connectivity unit 1820 may include a baseband chipset, and support communication such as GSM, GRPS, WCDMA, HSxPA, or the like.

The first memory apparatus 1830 that is a volatile memory apparatus may store data processed by the application processor 1810 as write data, or operate as a working memory. The first memory apparatus 1830 includes a switchable sense amplifier 1834 connected to the memory cell array 1832. The switchable sense amplifier 1834 includes a sense amplification unit for sensing a change in a voltage of a bit line connected to a memory cell in the memory cell array 1832 and amplifies a voltage difference between the bit line and a complementary bit line, and a plurality of switches for operating according to switching signals, and thus, enabling the switchable sense amplifier 1834 to perform a precharging operation, an offset cancellation operation, a charge sharing operation, a sensing operation, and a re-storing operation. The switchable sense amplifier 1814 may enhance an effective sensing margin of the switchable sense amplifier 1834 by compensating for an offset of the switchable sense amplifier 1834, by performing an offset cancellation operation.

The second memory apparatus 1840 that is a non-volatile memory apparatus may store a boot image for booting the mobile system 1800. For example, the non-volatile memory apparatus 1840 may be implemented as an electrically erasable programmable read-only memory (EEPROM), flash memory, PRAM, RRAM, nano floating gate memory (NFGM), polymer random access memory (PoRAM), MRAM, ferroelectric random access memory (FRAM), or a memory similar thereto.

The user interface 1850 may include one or more input apparatuses such as a keypad or a touchscreen and/or one or more output apparatuses such as a speaker or a display apparatus. The power supply apparatus 1860 may supply a working voltage to the mobile system 1800. Additionally, according to exemplary embodiments, the mobile system 1800 may further include a camera image processor (CIP), and further include a storage apparatus such as a memory card, a solid state drive (SSD), a hard disk drive (HDD), a compact disk-read only memory (CD-ROM), or the like.

Figure 19:
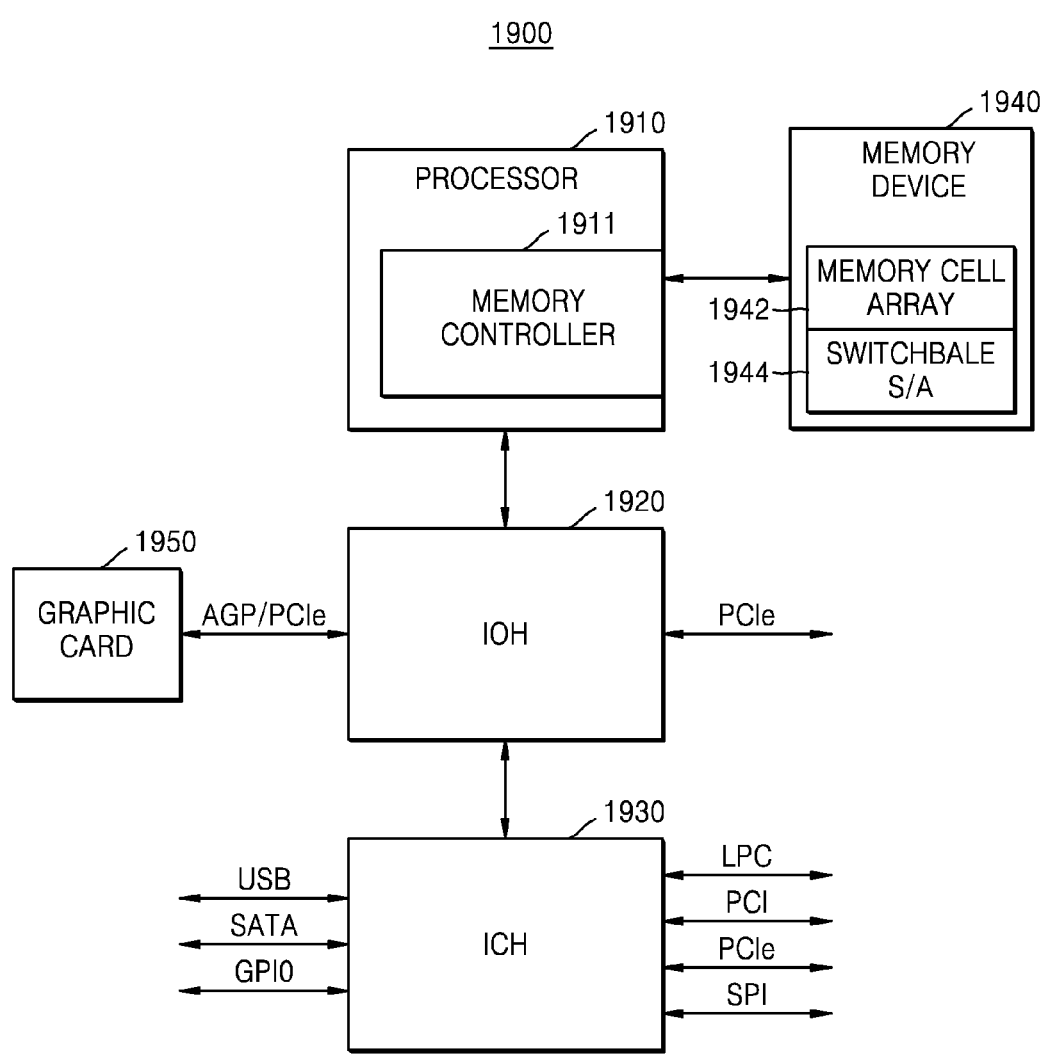
FIG. 19 is a block diagram of an example of applying a memory apparatus having a switchable sense amplifier to a computing system, according to exemplary embodiments.

FIG. 19 is a block diagram of an example of applying a memory apparatus 1940 having a switchable sense amplifier to a computing system 1900, according to exemplary embodiments.

Referring to FIG. 19, the computer system 1900 includes an application processor 1910, an input/output hub, an input/output controller hub 1930, a memory apparatus 1940, and a graphic card 1950. According to exemplary embodiments, the computer system 1900 may be an arbitrary computing system such as a personal computer (PC), a server computer, a workstation, a laptop computer, a mobile phone, a smartphone, a PDA, a PMP, a digital camera, a digital TV, a set-top box, a music player, a portable game console, a navigation system, or the like.

The application processor 1910 may perform various computing functions such as particular calculations or tasks. For example, the application processor 1910 may be a microprocessor or a central processing unit (CPU). According to exemplary embodiments, the application processor 1910 may include a single core or multiple cores. For example, the application processor 1910 may include a dual-core, quad-core, or hexa-core processor. FIG. 19 shows the computing system 1900 that includes the application processor 1910. However, according to exemplary embodiments, the computing system 1910 may include a plurality of processors. Additionally, according to exemplary embodiments, the application processor 1910 may further include a cache memory located inside or outside the application processor 1910.

The application processor 1910 may include a memory controller 1911 for controlling an operation of the memory apparatus 1940. The memory controller 1911 included in the application processor 1910 may be referred to as an integrated memory controller (IMC). According to exemplary embodiments, the memory controller 1911 may be located in the input/output hub 1920. The input/output hub 1920 that includes the memory controller 1911 may be referred to as a memory controller hub (MCH).

The memory apparatus 1940 includes a switchable sense amplifier 1944 connected to the memory cell array 1942. The switchable sense amplifier 1944 includes a sense amplification unit for sensing a change in a voltage of a bit line connected to a memory cell in the memory cell array 1942 and amplifying a voltage difference between the bit line and a complementary bit line. The switchable sense amplifier 1944 further includes a plurality of switches for operating according to switching signals, and thus, enabling the switchable sense amplifier 1944 to perform a precharging operation, an offset cancellation operation, a charge sharing operation, a sensing operation, and a re-storing operation. The switchable sense amplifier 1944 may enhance an effective sensing margin of the switchable sense amplifier 1844 by compensating for an offset of the switchable sense amplifier 1834, by performing an offset cancellation operation. Thus, performance of the memory apparatus 1940 may be enhanced.

The input/output hub 1920 may manage data transmission between the application processor 1910 and apparatuses such as the graphic card 1950. The input/output hub 1920 may be connected to the application processor 1910 via various types of interfaces. For example, the input/output hub 1920 and the application processor 1910 may be connected to each other via various standards of interfaces such as a front side bus (FSB), a system bus, HyperTransport, lightning data transport (LDT), quickpath interconnect (QPI), a common system interface (CSI), peripheral component interface-express (PCIe), or the like. FIG. 19 shows the computing system 1900 that includes the input/output hub 1920. However, the computing system 1900 may include a plurality of input/output hubs.

The input/output hub 1920 may provide various interfaces with apparatuses. For example, the input/output hub 1920 may provide an accelerated graphics port (AGP) interface, peripheral component interface-express (PCIe), a communications streaming architecture (CSA) interface, or the like.

The graphic card 1950 may be connected to the input/output hub 1920 via an AGP or PCIe. The graphic card 1950 may control a display apparatus (not shown) for displaying an image. The graphic card 1950 may include an internal processor and an internal semiconductor memory apparatus for processing image data. According to exemplary embodiments, the input/output hub 1920 may include a graphics device in the input/output hub 1920 instead of the graphics card 1950, or may include a graphics device in addition to the graphics card 1950 that is located outside the input/output hub 1920. The graphic apparatus included in the input/output hub 1950 may be referred to as integrated graphics. Additionally, the input/output hub 1920 that includes a memory controller and a graphic apparatus may be referred to as a graphics and memory controller hub (GMCH).

The input/output controller hub 1930 may perform data buffering and interface mediation so that various system interfaces may efficiently operate. The input/output controller hub 1930 may be connected to the input/output hub 1920 via an internal bus. For example, the input/output hub 1920 and the input/output controller hub 1930 may be connected to each other via a direct media interface (DMI), a hub interface, an enterprise southbridge interface (ESI), PCIe, or the like.

The input/output controller hub 1930 may provide various interfaces with peripheral apparatuses. For example, the input/output controller hub 1930 may provide a USB port, a serial advanced technology attachment (SATA) port, a general purpose input/output (GPIO), a low pin count (LPC) bus, a serial peripheral interface (SPI), PCI, PCIe, or the like.

According to exemplary embodiments, two or more elements, from among the application processor 1910, the input/output hub 1920, and the input/output controller hub 1930, may be implemented as a chipset.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to exemplary embodiments thereof, it will be understood that various changes in form and details may be made therein without departing from the spirit and scope of the following claims.

What is claimed is:

1. A sense amplifier comprising:
a sense amplification unit connected to a bit line, which is connected to a memory cell, and a complementary bit line and configured to sense a voltage change of the bit line and amplify a voltage difference between the bit line and the complementary bit line based on the sensed voltage change, when a word line of the memory cell is activated, wherein the sense amplification unit comprises:
a first p-channel metal-oxide semiconductor (PMOS) transistor connected between a first control signal and a first node, wherein a gate of the first PMOS transistor is connected to a third node;
a second PMOS transistor connected between the first control signal and a second node, wherein a gate of the second PMOS transistor is connected to a fourth node;
a first n-channel metal-oxide semiconductor (NMOS) transistor connected between the first node and a second control signal, wherein a gate of the first NMOS transistor is connected to the bit line; and
a second NMOS transistor connected between the second node and the second control signal, wherein a gate of the second NMOS transistor is connected to the complementary bit line; and
switches connected to the sense amplification unit and configured to perform, according to switching signals, an offset cancelling operation of cancelling an offset between the bit line and the complementary bit line, wherein:
the switches enable the sense amplification unit to perform each of a precharging operation on the bit line and the complementary bit line, a charge sharing operation of sharing charges between electric charges stored in the memory cell and electric charges stored in the bit line, and a sensing operation of amplifying the voltage difference between the bit line and the complementary bit line, according to the switching signals,
the switches comprise a first switch connected between the first node and the fourth node, and
when the first switch is turned on, the first and fourth nodes are connected to each other.

2. The sense amplifier of claim 1, wherein the sense amplification unit performs a re-storing operation of storing a voltage developed with respect to the bit line in the memory cell, after the sensing operation is performed.

3. The sense amplifier of claim 2, wherein the switches further comprise:
a second switch connected between the complementary bit line and the second node and configured to operate according to a first switching signal;
a third switch connected between the bit line and the second node and configured to operate according to a second switching signal;
a fourth switch connected between the complementary bit line and the first node and configured to operate according to the second switching signal;
a fifth switch connected between the first node and the third node and configured to operate according to the first switching signal; and
a sixth switch connected between the second node and the third node and configured to operate according to an inverted signal of the first switching signal.

4. The sense amplifier of claim 1, wherein the switches further comprise:
a second switch connected between the bit line and the first node;
a third switch connected between the complementary bit line and the second node; and
a fourth switch connected between the second node and the third node,
wherein:
the first, second, third, and fourth switches are turned on according to a set of switching signals, and
when the first, second, third, and fourth switches are turned on, the bit line and the first and fourth nodes are connected to each other and the complementary bit line, the second and third nodes are connected to each other, and the offset cancellation operation is performed.

5. The sense amplifier of claim 1, wherein the switches further comprise:
a second switch connected between the complementary bit line and the second node; and
a third switch connected between the first node and the third node,
wherein:
the first, second, and third switches are turned on according to a set of switching signals, and
when the first, second, and third switches are turned on, the complementary bit line and the second node are connected to each other, the first, third, fourth nodes are connected to each other, and the offset cancellation operation is performed.

6. The sense amplifier of claim 1, wherein the switches further comprise:
a second switch connected between the bit line and the first node;
a third switch connected between the complementary bit line and the second node;
a fourth switch connected between the bit line and the second node;
a fifth switch connected between the complementary bit line and the first node; and
a sixth switch connected between the second node and the third node,
wherein:
the first through sixth switches are turned on according to a set of switching signals, and
when the first through sixth are turned on, the bit line and the complementary bit line are connected to each other, and the precharging operation of charging the bit line and the complementary bit line with a precharge voltage is performed.

7. The sense amplifier of claim 1, wherein the switches further comprise:
a second switch connected between the second node and the third node,
wherein:
the first and second switches are turned on according to a set of switching signals, and
when the first and second switches are turned on, the second and third nodes are connected to each other, and the charge sharing operation is performed.

8. The sense amplifier of claim 1, wherein the switches further comprise:
a second switch connected between the bit line and the second node;
a third switch connected between the complementary bit line and the first node; and
a fourth switch connected between the second node and the third node, wherein:
the first, second, third, and fourth switches are turned on according to a set of switching signals, and
when the first, second, third, and fourth switches are turned on the sensing operation is performed by using a circuit in which the first and second PMOS transistors and the first and second NMOS transistors are configured to be cross-coupled to the complementary bit line and the bit line.

9. A sense amplifier comprising:
a sense amplification unit connected to a bit line, which is connected to a memory cell, and a complementary bit line and configured to sense a voltage change of the bit line and amplify a voltage difference between the bit line and the complementary bit line based on the sensed voltage change, when a word line of the memory cell is activated, wherein the sense amplification unit comprises:
a first p-channel metal-oxide semiconductor (PMOS) transistor connected between a first control signal and a first node, wherein a gate of the first PMOS transistor is connected to a third node;
a second PMOS transistor connected between the first control signal and a second node, wherein a gate of the second PMOS transistor is connected to a fourth node;
a first n-channel metal-oxide semiconductor (NMOS) transistor connected between the first node and a second control signal, wherein a gate of the first NMOS transistor is connected to the bit line; and
a second NMOS transistor connected between the second node and the second control signal, wherein a gate of the second NMOS transistor is connected to the complementary bit line; and
switches connected to the sense amplification unit and configured to perform, according to switching signals, an offset cancelling operation of cancelling an offset between the bit line and the complementary bit line, wherein:
the switches enable the sense amplification unit to perform each of a precharging operation on the bit line and the complementary bit line, a charge sharing operation of sharing charges between electric charges stored in the memory cell and electric charges stored in the bit line, and a sensing operation of amplifying the voltage difference between the bit line and the complementary bit line, according to the switching signals,
the switches comprise a first switch connected between the second node and the fourth node, and when the first switch is turned on, the second and fourth nodes are connected to each other.

10. The sense amplifier of claim 9, wherein the switches further comprise:
a second switch connected between the bit line and the first node;
a third switch connected between the complementary bit line and the second node; and
a fourth switch connected between the first node and the third node,
wherein:
the first, second, third, and fourth switches are turned on according to a set of switching signals, and
when the first, second, third, and fourth switches are turned on, the bit line and the first and third nodes are connected to each other, the complementary bit line and the second and fourth nodes are connected to each other, and the offset cancellation operation is performed.

11. The sense amplifier of claim 9, wherein the switches further comprise:
a second switch connected between the bit line and the first node; and
a third switch connected between the second node and the third node,
wherein:
the first, second, and third switches are turned on according to a set of switching signals, and
when the first, second, and third switches are turned on, the bit line and the first node are connected to each other, the second, third, and fourth nodes are connected to each other, and the offset cancellation operation is performed.

12. The sense amplifier of claim 9, wherein the switches further comprise:
a second switch connected between the first node and the third node,
wherein:
the first and second switches are turned on according to a set of switching signals, and
when the first and second switches are turned on, the first and third nodes are connected to each other via a node, the second and fourth nodes are connected to each other via another node, and the charge sharing operation is performed.

13. The sense amplifier of claim 9, wherein the sense amplification unit performs a re-storing operation of storing a voltage developed with respect to the bit line in the memory cell, after the sensing operation is performed.

* * * * *